US010853536B1

(12) United States Patent
Steingrimsson et al.

(10) Patent No.: US 10,853,536 B1
(45) Date of Patent: Dec. 1, 2020

(54) AUTOMATIC REQUIREMENT VERIFICATION ENGINE AND ANALYTICS

(71) Applicants:Baldur Andrew Steingrimsson, Hillsboro, OR (US); Anand Kulkarni, Davidson, NC (US)

(72) Inventors: Baldur Andrew Steingrimsson, Hillsboro, OR (US); Anand Kulkarni, Davidson, NC (US)

(73) Assignee: Imagars LLC, Hillsboro, OR (US)

(*) Notice: Subject to any disclaimer, the term of this patent is extended or adjusted under 35 U.S.C. 154(b) by 89 days.

(21) Appl. No.: 15/613,183

(22) Filed: Jun. 3, 2017

Related U.S. Application Data

(63) Continuation-in-part of application No. 14/567,516, filed on Dec. 11, 2014, now Pat. No. 9,923,949.
(Continued)

(51) Int. Cl.
*G06F 30/20* (2020.01)

(52) U.S. Cl.
CPC .................... *G06F 30/20* (2020.01)

(58) Field of Classification Search
CPC .... G06F 16/958; G06F 17/50; G06F 17/5009; G06F 2217/04; G06F 3/048; G06F 8/20; G06Q 10/00; G06Q 10/06; G06Q 10/063118; G06Q 10/06313; G06Q 10/06315; G06Q 10/0633; G06Q 10/0635; G06Q 10/0637; G06Q 10/06375; G06Q 10/06395; G06Q 10/10; G06Q 10/101; G06Q 10/103; G06Q 10/109; G06Q 10/1093; G06Q 50/01; H04L 41/145; H04L 51/32; H04L 67/02
See application file for complete search history.

(56) References Cited

U.S. PATENT DOCUMENTS

| | | | | | |
|---|---|---|---|---|---|
| 5,822,206 | A | * | 10/1998 | Sebastian | ............ B29C 33/3835 700/97 |
| 6,961,687 | B1 | * | 11/2005 | Myers, Jr. | .............. G06Q 10/06 703/6 |

(Continued)

OTHER PUBLICATIONS

U.S. Appl. No. 14/567,516, filed Dec. 11, 2014, B. Steingrimsson.
U.S. Appl. No. 61/345,760, filed Jun. 4, 2016, B. Steingrimsson.

*Primary Examiner* — Christopher Biagini

(57) ABSTRACT

This invention presents a transformative design decision support tool (an e-Design Assessment Engine), one that
1. Significantly reduces cost and risk of engineering design projects, over the state of affair, in part through early and automatic detection of design oversights;
2. Offers compelling reduction in the development time of designs, through improved productivity, but without compromising quality or creativity;
3. Offers wide range of flexibility in terms of supporting design processes employed at different design organizations.

The design oversights are identified through proper structuring of the engineering design requirements, extraction of relevant design parameters through application program interfaces provided by the pertinent design tools, and mapping against the requirements. Big data analytics are applied to repositories of past designs, for the purpose of improving new designs. The Engine can be used stand-alone, as a part of a design ecosystem, or integrated into existing systems for product lifecycle or data management.

23 Claims, 33 Drawing Sheets

Related U.S. Application Data

(60) Provisional application No. 62/345,760, filed on Jun. 4, 2016.

(56) References Cited

U.S. PATENT DOCUMENTS

| | | | | |
|---|---|---|---|---|
| 7,007,235 | B1* | 2/2006 | Hussein | G06Q 10/10 715/751 |
| 8,707,246 | B2* | 4/2014 | Chen | G06Q 50/01 717/101 |
| 9,065,638 | B2* | 6/2015 | Kamijoh | G06F 21/6209 |
| 2002/0007348 | A1* | 1/2002 | Ali | G06Q 10/06 705/51 |
| 2002/0133504 | A1* | 9/2002 | Vlahos | G06F 16/256 |
| 2003/0204823 | A1* | 10/2003 | Armstrong | G06F 17/50 703/1 |
| 2005/0216429 | A1* | 9/2005 | Hertz | G06Q 10/06 |
| 2006/0052890 | A1* | 3/2006 | Selway | G06F 17/50 700/97 |
| 2006/0095882 | A1* | 5/2006 | Mankin | G06F 17/5045 716/137 |
| 2006/0117012 | A1* | 6/2006 | Rizzolo | G06Q 10/06 |
| 2007/0106490 | A1* | 5/2007 | Zhu | G06F 17/5022 703/22 |
| 2008/0077542 | A1* | 3/2008 | McElhiney | G06Q 30/02 705/400 |
| 2008/0263505 | A1* | 10/2008 | StClair | G06F 8/10 717/101 |
| 2009/0157453 | A1* | 6/2009 | Araki | G06Q 10/06 705/7.41 |
| 2011/0213757 | A1* | 9/2011 | Bhaskaran | G06Q 10/06 707/687 |
| 2011/0252163 | A1* | 10/2011 | Villar | G06F 17/5027 710/16 |
| 2012/0062582 | A1* | 3/2012 | Okunev | G06T 11/206 345/589 |
| 2013/0124483 | A1* | 5/2013 | Furuhashi | G06F 16/22 707/661 |
| 2014/0118223 | A1* | 5/2014 | Jensen | G06F 3/048 345/2.2 |
| 2014/0122613 | A1* | 5/2014 | Mashkif | G06Q 10/101 709/205 |
| 2014/0129753 | A1* | 5/2014 | Schuette | G06F 13/4068 710/301 |
| 2014/0258187 | A1* | 9/2014 | Suleiman | G06N 20/00 706/12 |
| 2015/0134398 | A1* | 5/2015 | Xiao | G06Q 10/0635 705/7.28 |
| 2016/0294635 | A1* | 10/2016 | Nasle | G01R 31/2848 |

\* cited by examiner

FR. 1: Apply tensile force to 3/4" hex head bolt
- PR. 1.1: Vertical reaction force at the bolt shoulder should be at least 30,000 lbf.
- PR. 1.2: 5 year useful life
- PR. 1.3: Factor of safety >=3

FIG. 14

FR. 1.3.1.1: Resist deformation without yielding
  ↳ PR 1.3.1.1.1: Maximum stress in the arm should remain below the Von Mises stress criteria for the chosen material (103 ksi for steel).

FIG. 15

2101
2102
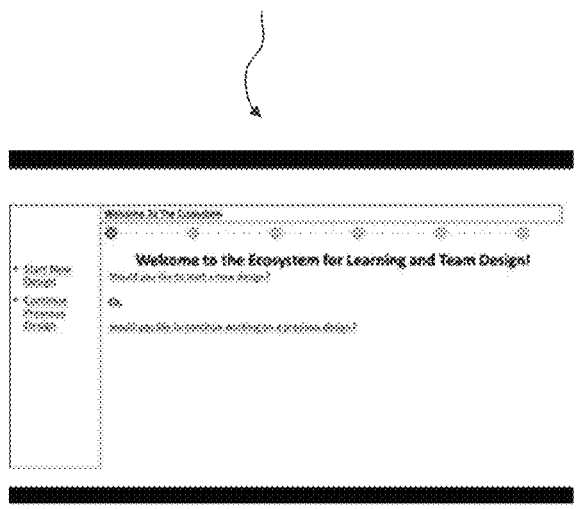
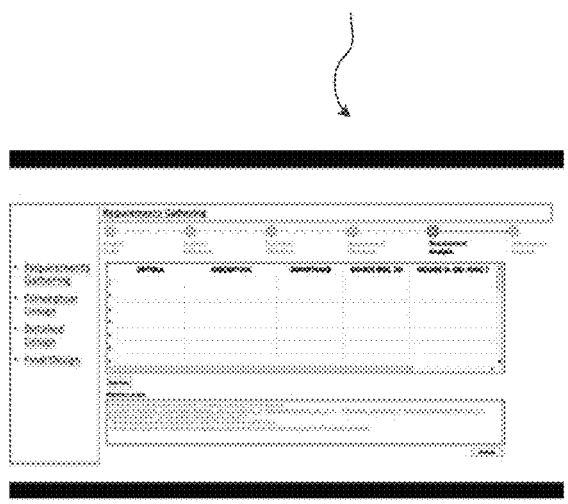
FIG. 21

2401

| Project 1 | Project 2 | Project 3 | ... |
|---|---|---|---|
| Requirement Gathering | Concept Design | Detailed Design | Final Design |
| Project Goals | Problem Statement | Customer Definition | ... |

Tier 1: Project Names
Tier 2: Design Phase
Tier 3: Step within Design Phase

2402

| Chassis | Power-plant | Drive-train | ... |
|---|---|---|---|
| Requirement Gathering | Concept Design | Detailed Design | Final Design |
| Project Goals | Problem Statement | Customer Definition | ... |

Tier 1: Subsystem Names
Tier 2: Design Phase for subsystem
Tier 3: Step within Design Phase

FIG. 24

AUTOMATIC REQUIREMENT VERIFICATION ENGINE AND ANALYTICS

ACKNOWLEDGEMENT OF FEDERAL FUNDING

This patent is the result of research conducted under support of National Science Foundation Awards 1,447,395 and 1,632,408.

CROSS REFERENCE TO RELATED APPLICATIONS

Utility patent application Ser. No. 13/865,549, filed on Apr. 18, 2013.
Utility patent application Ser. No. 14/567,516, filed on Dec. 11, 2014.
Provisional patent application No. 62/345,760, filed on Jun. 4, 2016.

BACKGROUND OF THE INVENTION

1. Technical Field Description

This patent addresses problems related to high cost of design oversights, if discovered late in the design process. According to (Harry 1999),
"If a reliability problem is detected during engineering, the cost of the product goes up by a factor of 10. If the problem is caught in production phase, the cost of the product increases by a factor of 100 or more."

Engineers working for a given design organization typically need to follow the internal design processes of the organization. Ideally, the design engineers would like to have access to a design decision support tool that could provide advisories, throughout the design work, on the extent to which their design work conformed to a given design process (the quality of their design activities relative to a certain stage in the design process). This would minimize the chance of design pitfalls, contribute to shorter design cycles and result in final designs of higher overall quality.

Per FIG. 1 and FIG. 2, there is a need for a high-level design assessment tool, one capable of early identification of design oversights, one that can analyze all stages of the engineering design process, one that can interface seamlessly with existing tools for engineering design, and when desired, one that can be integrated into existing tools for requirement management.

2. Description of Prior Art

Prior Art on Automatic Assessment of Designs Relative to a Design Process

The design process is an iterative process used on ill-defined, and often open-ended, problems. This process is used by both professional and novice designers to enable them to solve design problems. It is a divergent-convergent thinking process that goes from the generation of diverse solutions to its depuration and to choosing the solution that yields the best match to the requirements. Generally, the five stages in the design process are requirements modeling, functional modeling, concept design, embodiments design, and detailed design (see FIG. 1). During the requirements modeling stage, analysis of market needs is performed to yield a problem statement that consists of the requirements that the product must fulfill. Generally, the four stages in the design process are requirements modeling, concept design, detailed design, and final design (see FIG. 1). During the requirements modeling stage, analysis of market needs is performed to yield a problem statement that consists of the requirements that the product must fulfill. In the concept design stage, several concepts are produced, each depicting the physical principles for solving the design problem. During the detailed design stage, a more detailed analysis is performed on the concepts selected. In the final design stage, production and operating documents are developed for the manufacture of the design solution.

In terms of prior work on automatically evaluating designs relative to a design process, (Brewer 2000) offers the closest analogue. Here an attempt is made to automatically evaluate the cost and customer value of a design, and even generate the design from the requirements (!), but not assess compliance with the design process.

(Jensen 2014) presents a method for selecting a view of a graphical rendering of an object. While this method can be applied to select a view for graphical rendering of mechanical objects, it does not address the design process directly, nor does it address assessment of designs relative to the design process.

Prior Art on Automatic Requirement Verification

For prior art on automatic design verification, refer primarily to (Richter 2014) and the references listed therein. (Richter 2014) describes a method and device for automatically verifying the design of a technical system. The method includes the steps of providing a specific first contract for a first component of the design, a specific second contract for a second component of the design, and a specific third contract for a third component of the design, each specific contract characterizing all possible input and output values of the corresponding component, verifying that the first contract is satisfiable by a pregiven model of the first component, the second contract is satisfiable by a pregiven model of the second component and the third contract is satisfiable by a pregiven model of the third component. This method seems aimed at the detailed design phase. It does not appear to address all the phases in the design process, nor does it seem to address early identification of design oversights through real-time alerts.

Other prior art includes (StClair 2008), (Zhu 2007), and (Rizzolo 2006). (StClair 2008) outlines an exemplary system for electronically managing requirements for software development, one that includes a project module, a requirements module, a mapping module and a verification module. This is not a generic tool for verification of engineering requirements, but one that seems limited to static analysis, code coverage, unit integration and testing of software development requirements. Similarly, (Zhu 2007) describes a verification tool supporting circuit design (large-scale integration).

(Rizzolo 2006) presents a system for critical parameter and requirements management. In one embodiment, the process includes a product structure classification scheme, a parameter/requirements classification scheme, a parameter/requirements process and maturity model, and in-process and requirements conformance views. But it does not seem to offer mechanism for automatic requirement verification (and hence for early identification of design oversights).
Integration into Tools for Computer Aided Design, Computer Aided Engineering, Product Life Cycle Management, Product Data Management or Requirement Management For relevant prior art, refer to (Kamijoh 2015) and (Mashkif 2014), and the references listed therein. (Mashkif 2014) describes a project configuration management system for multi-disciplinary development projects. A systematic approach is applied to control changes to the identified attributes for the purpose of maintaining system integrity and traceability throughout the product's life cycle. (Mashkif 2014) outlines communications between a collaborative relationship hub and communication management tool through a communication interface. It even mentions tools such as DOORs and Rhapsody. But unlike this invention, with its emphasis on project management, (Mashkif 2014) does not address automatic verification of engineering requirements (early identification of design oversights). (Kamijoh 2015) similarly describes an integrated project management system, but does not address automatic verification of engineering requirements.

Application of Big Data Analytics for Improved Design Decision Fidelity

Prior art related to big data analysis includes (Schuette 2014), (Furuhashi 2013) and the references listed therein. (Schuette 2014) presents Architectures and methods for performing big data analytics by providing an integrated storage/processing system containing non-volatile memory devices that form a large, non-volatile memory array and a graphics processing unit configured for general purpose computing. (Furuhashi 2013) outlines a system and method for operating a big-data platform that includes at a data analysis platform, receiving discrete client data; storing the client data in a network accessible distributed storage system that includes: storing the client data in a real-time storage system; and merging the client data into a columnar-based distributed archive storage system; receiving a data query request through a query interface; and selectively interfacing with the client data from the real-time storage system and archive storage system according to the query.

While (Furuhashi 2013) does address storage and retrieval of big data entities, it does not address its application to the process of engineering design.

Electronic Design Notebooks

Refer to (Steingrimsson 2014) and the prior art listed therein.

Agile Processes for Software Development

Refer to (Steingrimsson 2014) and the prior art listed therein.

Team Design

Refer to (Steingrimsson 2014) and the prior art listed therein.

Software for Team Collaboration and Team Management

Refer to (Steingrimsson 2014) and the prior art listed therein.

REFERENCES (Harry 1999) R. S. M. Harry, Six Sigma: The Breakthrough Management Strategy Revolutionizing the World's Top Corporations, Reed Business Information, Inc., 1999

(Brewer 2000) J. T. Brewer, C. M. Luffy, R. J. Luffy, C. R. Salay, J. M. Vishnauski, D. R. Wallace, M. R. Woodruff and J. L Younghans. System for evaluating designs. United States Patent Application Publication No. EP1056026 A2, Nov. 29, 2000.

(Jensen 2014) C. G. Jensen, T. T. Nysetvold, C. C. Teng, A. Hepworth, B. Stone and P. Cox. Graphical View Selection System, Method, and Apparatus. United States Patent Application Publication No. US 2014/0118223 A1, May 1, 2014.

(Richter 2014) J. Richter. Method and device for automatically verifying a design of a technical system. WO Application No. PCT/EP2014/075153, Publication date of May 26, 2016.

(Zhu 2007) Q. Zhu. Verification Support Method, Verification Supporting Apparatus, and Computer Product. United States Patent Application Publication No. US 2007/0106490 A1, May 10, 2007.

(StClair 2008) W. G. StClair. Automated Management of Software Requirements Verification. United States Patent Application Publication No. US 2008/0263505 A1, Oct. 23, 2008.

(Rizzolo 2006) C. D. Rizzolo, R. E. Stokes, L. F. LaVallee, C. M. Gardiner, W. R. Smith, K. Cupo, R. S. Pagano, J. S. Cornell, B. P. Mandel, R. E. Simpson and J. T. Potter. Critical Parameter/Requirements Management Process and Environment. United States Patent Application Publication No. US 2006/0117012 A1, Jun. 1, 2006.

(Kamijoh 2015) K. Kamijoh, H. Miyashita and H. Nakamura. System, Method, and Program for Information Management. U.S. Pat. No. 9,065,638 B2, Jun. 23, 2015.

(Mashkif 2014) N. Mashkif, A. Sela and U. Shani. Cross-Domain Collaborative Configuration Management. United States Patent Publication No. 2014/0122613 A1, May 1, 2014.

(Schuette 2014) F. M. Schuette, G. J. Calder, Y. Klein and S. J. Smith. Integrated Storage/Processing Devices, Systems and Methods for Performing Big Data Analytics. United States Patent Publication No. 2014/0129753 A1, May 8, 2014.

(Furuhashi 2013) S. Furuhashi, H. Yoshikawa and K. Ota. System and Method for Operating a Big-Data Platform. United States Patent Publication No. 2013/0124483 A1, May 16, 2013.

(Steingrimsson 2014) B. Steingrimsson, "All-Electronic Ecosystems for Design and Collaboration". U.S. patent Ser. No. 14/567,516, Dec. 11, 2014.

(Rao 2009) Rao, S. S., 2009. Engineering Optimization: Theory and Practice. $4^{th}$ Edition Hoboken, N.J.: John Wiley & Sons, Inc.

(Sen 2011) Sen, C., 2011. A Formal Representation of Mechanical Functions to Support Physics-Based Computational Reasoning in Early Mechanical Design. Thesis (PhD). Clemson University.

(Sen 2010) Sen, C., et al., 2010. Evaluation of the functional basis using an information theoretic approach. Artificial Intelligence for Engineering Design, Analysis and Manufacturing, 24 (01), 87.

(Suh 1990) Suh, N. P., 1990. The Principles of Design. New York: Oxford University Press.

(Suh 1995) Suh, N. P., 1995. Designing-in of Quality Through Axiomatic Design. IEEE Transactions on Reliability, 44 (2), 256-264.

(Suh 1999) Suh, N. P., 1999. A Theory of Complexity, Periodicity and the Design Axioms. Research in Engineering Design, 11 (2), 116-132.

Suhir, E., et al., 2015. Probabilistic design for reliability in electronics and photonics: Role, significance, attributes, challenges. IEEE International Reliability Physics Symposium Proceedings, 2015-May 5C11-5C113.

(Manual 2015) Imagars, "User Manual for Ecosystem for Learning and Team Design Ver. 1.0 (Instructor Version)," http://www.imagars.com/release/UserManual-Ecosystem-Instructor-1.0.pdf, 2015.

(Notebooks 2015) Imagars, "Electronic Design Notebooks for Bolt Tester Use Case Corresponding to Ver. 0.60 of Ecosystem Client," http://www.imagars.com/release/DesignFiles.EcosystemClient.v0p60.zip, Jun. 29, 2015.

(Library 2000) American Library Association, "Information Literacy Competency Standards for Higher Education," no. http://www.ala.org/acrl/sites/ala.org.acrl/files/content/standards/standards.pdf, 2000.

(Jones 2015) R. Jones, "A Digital Ecosystem for Learning and Team Design: A Feasibility Study," Master Report, Portland State University, http://www.imagars.com/MS_Report_Robert_Jones.pdf, June 2015.

(POLE 2015) POLE, "Portable Library for Structured Storage," http://www.dimin.net/software/pole/, Dec. 23, 2015.

(Roy 2013) A. C. a. S. Roy, "On reducing the influence of Condorcet cycles from pairwise elections data," Int. J. Social Choice Theory, vol. 40, no. 4, pp. 1143-1158, 2013.

(Imagars 2015) Imagars LLC, Final Phase I SBIR Report, submitted to the National Science Foundation on Jul. 15, 2015.

(Model-View 2015) Wikipedia, "Model-View-Controller," https://en.wikipedia.org/wiki/Model-view-controller, Dec. 24, 2015.

(Wt 2015) EmWeb, "Wt: A C++ Web Toolkit," http://www.webtoolkit.eu/wt, July, 2015.

(OpenIPT 2015) A. Community, "Version problem to open ipt file," https://forums.autodesk.com/t5/inventor-general-discussion/version-problem-to-open-ipt-file/td-p/4446209, Dec. 26, 2015.

(StpIgs 2015) A. Community, "IAM file conversion to STP or IGS," https://forums.autodesk.com/t5/inventor-general-discussion/iam-file-conversion-to-stp-or-igs/td-p/3745333, Dec. 26, 2015.

(LibreDWG 2015) G. O. System, "GNU LibreDWG," http://www.gnu.org/software/libredwg/, Dec. 26, 2015.

(LibreCAD 2015) LibreCAD, "Adding DWG Support," http://blog.librecad.org/2011/04/adding-dwg-support/, Dec. 26, 2015.

(OpenDWG 2015) SourceForge, "OpenDWG," http://sourceforge.net/projects/opendwg/, Dec. 26, 2015.

(AbaPy 2015) abapy, "Tutorial," http://abapy.readthedocs.org/en/latest/tutorial.html#introduction, Dec. 26, 2015.

(OdpCPP 2015) StackOverflow, "Accessing parts with Abaqus ODB C++ API," http://stackoverflow.com/questions/11782417/accessing-parts-with-abaqus-odb-c-api, Dec. 26, 2015.

(ParaView 2015) ParaView, "Welcome to ParaView," http://www.paraview.org/, Dec. 23, 2015.

(ParaStruct 2015) ParaView, "ParaView for Structural Analysis," http://www.paraview.org/structural-analysis/, Dec. 26, 2015.

(OpenFOAM 2015) OpenFOAM, "Free Open Source CFD," http://www.openfoam.org/, Dec. 26, 2015.

(FreeCAD 2015) FreeCAD, "Welcome!," http://www.freecadweb.org/, Dec. 26, 2015.

(OpenCascade 2015) Open Cascade, "Home," http://www.opencascade.com/, Dec. 26, 2015.

(PySolidWorks 2016) G. Groups, "Python & Solidworks!," https://groups.google.com/forum/#!topic/comp.cad.solidworks/39N6g3Y1aSo, Dec. 26, 2016.

(PyWinExtend 2015) M. Hammond, "Python for Windows extensions," http://starship.python.net/~skippy/win32/, Dec. 26, 2015.

(PyWinCAD 2015) P. f. W. R. a. Examples, "The Python Script Collection for Windows—CAD Systems," http://win32com.goermezer.de/content/category/7/160/291, Dec. 26, 2015.

(FreeCADScript 2015) FreeCAD, "Scripting Examples," http://www.freecadweb.org/wiki/index.php?title=Scripting_examples, Dec. 26, 2015.

(PyAcad 2015) SourceForce, "PyAcad 0.4.01," http://pyacad.sourceforge.net/, Dec. 26, 2015.

(PyAutoCad 2015) Python, "pyautocad 0.2.0," https://pypi.python.org/pypi/pyautocad/, Dec. 26, 2015.

(AbaqScript 2015) Dassault Systèmes Simulia Corp, "Abaqus 6.12 Scripting User's Manual," http://things.maths.cam.ac.uk/computing/software/abaqus_docs/docs/v6.12/pdf_books/SCRIPT_USER.pdf, Dec. 26, 2015.

(AbaqScript 2010) J. Overvelde, "Learn Abaqus script in one hour," http://bertoldi.seas.harvard.edu/files/bertoldi/files/learnabaqusscriptinonehour.pdf, Dec. 12, 2010.

(Workbench 2015) ANSYS, "Customizing ANSYS Workbench," https://support.ansys.com/staticassets/ANSYS/Conference/Houston/downloads/Customizing%20ANSYS%20Workbench.pdf, Dec. 26, 2015.

(StarCCM 2015) P. Exchange, "EnSight's Python Repository," http://pythonexchange.com/tag/star-ccm/, Dec. 26, 2015.

(SolidWorksAPI 2015) SolidWorks API, "What does it take to learn the SolidWorks API?," https://swapi.wordpress.com/, Dec. 26, 2015.

(SupportAPI 2015) SolidWorks, "API Support," https://www.solidworks.com/sw/support/api-support.htm, Dec. 26, 2015.

(PtcSupport 2015) P. Support, "API Wizards Online," http://support.ptc.com/support/apiwizard.htm, Dec. 26, 2015.

(ObjectARX 2015) A. D. Network, "ObjectARX," http://usa.autodesk.com/adsk/servlet/index?siteID=123112&id=773204, Dec. 26, 2015.

(CATIA 2015) ENG-TIPS.com, "Catia V5 Plug-in Developement Documentation?," http://www.eng-tips.com/viewthread.cfm?qid=345694, Dec. 26, 2015.

(CD-Adapco 2015) CD-Adapco, "JAVA™ Scripting—Process Automation," http://www3.cd-adapco.com/training/courses/java_scripting_process_automation.html, Dec. 26, 2015.

(ANSYS 2015) ANSYS, "ANSYS Basic Analysis Procedures Guide," http://mostreal.sk/html/guide_55/g-bas/GBAS18.htm, Dec. 26, 2015.

(SolidMacros 2016) Dassault Systemes, "Recording SolidWorks Macros," http://help.solidworks.com/2013/English/api/sldworksapiprogguide/GettingStarted/SolidWorks_Macros.htm, Jan. 25, 2016.

(CreoTutorial 2016) PTC University Learning Exchange, "All PTC Creo Tutorials," http://learningexchange.ptc.com/tutorials/by_product/product_id:1, Jan. 27, 2016.

(AutoUser 2016) AutoCAD 2013, "User's Guide," http://docs.autodesk.com/ACDMAC/2013/ENU/PDFs/acdmac_2013_users_guide.pdf, Jan. 25, 2016.

(DassultDevGuide 2016) Dassault Systemes, "Developer's Guides," http://www.3ds.com/support/documentation/developers-guides/, Jan. 25, 2016.

(AbaqusGuide 2016) Abaqus 6.13, "Abaqus Scripting User's Guide," http://129.97.46.200:2080/v6.13/books/cmd/default.htm, Jan. 22, 2016.

(AnsysPdf 2016) ANSYS, "ANSYS Inc. PDF Documentation for Release 15.0," http://148.204.81.206/Ansys/readme.html, Jan. 25, 2016.

(CD-Adapco 2016) CD-Adapco, "The Steve Portal," https://steve.cd-adapco.com/Site_Login, Jan. 25, 2016.

(SolidWorksDocMgr 2017) Dassault Systemes, "Solid-Works API Help," http://help.solidworks.com/2017/English/api/swdocmgrapi/GettingStarted-swdocmgrapi.html, May 29, 2017.

SUMMARY OF THE INVENTION

To address limited capabilities for interactive team design, amidst thrust for enhanced productivity (shorter design cycles), cost savings, unlocking creativity and for high quality, this invention extends the work of (Steingrimsson 2014) and presents an all-electronic ecosystem for engineering team design (FIG. 3 and FIG. 4) as well as its core design assessment engine, the e-Design Assessment Engine, as a stand-alone entity (FIG. 5). The ecosystem is presented to make organizations involved in design or planning more productive as a whole, as well as the individual design engineers. For this reason, the communication capabilities are essential, plus the ability to integrate with CAD packages, FEA, DPM, CPD and PLM systems. This ecosystem stores design content in a structured database (schema) format, such as XML. The design project journals are referred to as e-design notebooks. The ecosystem is capable of applying big data analytics to repositories of known good designs, for the purpose of improving design decision fidelity for new designs. The invention presents the e-Design Assessment Engine as a stand-alone entity, for automatic verification of engineering requirements, capable of extracting design parameters from the tools used for engineering design, through the appropriate interfaces, mapping design entities from any of the design process stages against the requirements, and promptly flagging an alert in case of a mismatch. The e-Design Assessment engine is suitable for integration into existing tool for requirement management, DPM, CPD or PLM.

This invention presents the Ecosystem as a design decision support framework, one that
1. Helps design students, such as capstone students, learn proper design techniques, develop engineering judgement and foster creativity, in a stimulating and user-friendly fashion;
2. Significantly reduces cost and risk of engineering design projects, over the state of affair, in part through early and automatic detection of design pitfalls;
3. Offers compelling reduction in the development time of designs, through improved productivity, but without compromising quality or creativity in any way;
4. Offers wide range of flexibility in terms of supporting design processes taught at different universities, or employed at different engineering organizations, by accounting for multiple degrees of variations.

1. User-Friendly Tool for Teaching Proper Design Techniques, Developing Engineering Judgement and Fostering Creativity Being one of the ABET requirements, essentially all engineering programs offer a capstone class of some type. The ecosystem can assist with prompt evaluation of capstone design projects. The ecosystem can help students learn proper design techniques, minimize chance of mistakes, and help students learn from their mistakes. The ecosystem contributes towards
1. Enhanced learning, through automatic assessment of quality of design activities w.r.t. to the design process.
2. Enhanced creativity, resulting in more bandwidth available to focus on higher-level problem solving.

Historically, evaluation and reporting (communication) has proven quite time intensive for faculty and mentors. With time being a scarce resource, the assessment can be prone to subjectivity. The ecosystem offers electronic design notebooks (project journals), capable of producing stimulating real-time alerts aimed at preventing design pitfalls and ensuring designers stay on track throughout their design projects.

The ecosystem offers a flexible design decision (learning) support platform, one where administrative functions associated with the design process are automated. But it still helps develop engineering judgement by prompting for and systematically capturing the rationale for various design decisions. The Ecosystem can be introduced into design classes as an optional tool, to begin with. Students still can carry out functional decomposition of design concepts in MS Excel, or even by hand, if they prefer, and upload into the Ecosystem. Similarly, they can upload schedules from MS Project or analysis results from ANSYS (or similar design tools). The ecosystem embraces (supplements), but does not compete against, the established design tools.

2. Reducing the Cost and Risk of Engineering Design Projects

The ecosystem helps with identifying design oversights early in the design process. Early detection constitutes prevention, and can significantly reduce the overall project cost and risk. According to (Harry 1999), "If a reliability problem is detected during engineering, the cost of the product goes up by a factor of 10. If the problem is caught in production phase, the cost of the product increases by a factor of 100 or more."

The various automation mechanisms, such as the self-generating reports, also help improve productivity (improve efficiency of the design process), shorten design time and reduce the overall project cost.

3. Compelling Reduction in the Development Time of Design Projects

The automation facilities, the optimization framework and the real-time alerts contribute towards productivity improvements and prevention of design oversights (and hence the need for rework). This results in significant reduction in the effort needed, which can translate into reduction of development time and/or decrease in the man power needed.

4. Flexibility: Ability to Account for Design Processes with Different Levels of Formality (Steingrimsson 2014) presents a sound baseline framework, with significant flexibility:
1. While the essential ingredients are provided, designers can omit given parcels, as long as justifications are provided.
2. Through a configuration menu, designers can elect to omit design steps not considered absolutely necessary, for a given design project, and run as often as desired through the important steps.

In additional to waterfall design approach, the Ecosystem supports agile as well as hybrid design practices.

3. The ecosystem of (Steingrimsson 2014) can be used in conjunction with a variety of $3^{rd}$ party tools for team communication, such as Google Drive, Microsoft OneDrive or Dropbox.

This invention expands further on this flexibility:
1. To those with subscription in place, we will be offering an interface to online industry databases and standards (for context verification).
2. Depending on the development tools available, the Ecosystem will conduct holistic assessment of the outputs in relation to the design process.

FIG. 3 provides a high-level system diagram featuring the e-Design Assessment. It features the following:
1. Cloud communication system.
   For reduction of risk through comparison with archives of reference designs (known good examples).
2. Web interface.
   This is a fully functioning web application (agnostic to the operating system involved).
3. Interfaces with the individual design tools.
4. Interfaces with the industry databases (standards).
   For verifying relevance of the user input in the context of the design project at hand.
5. Core e-Design Assessment Engine.
   Friendly explanations on design oversights identified (suggestions to designer to go back and check).
6. Supervisor customization mode.
   Since the supervisor is typically the decision maker, when it comes to making a decision on adoption, we want to ensure the ecosystem offers adequate benefits to the supervisor (as well as to the students).
7. Advanced feature integration.
   The ecosystem is an integrated design decision support system.
   The integrated decision support system accounts for the outputs from the solid modeling, finite element analysis (FAE) and computational fluid dynamics (CFD) development tools, simulation files and more.
   The outcome can consist of a huge database, one paving the way for some big data analysis.

Other aspects and features of the present invention will be readily apparent to those skilled in the art from reviewing the detailed description of the preferred embodiments in conjunction with the accompanying drawings.

The invention presents 15 primary use cases. The present invention is not restricted to these embodiments. Variations can be made herein without departing from the scope of the invention.

DESCRIPTION OF THE DRAWINGS

FIG. 14 presents the main functional requirement for the bolt tester example, along with the associated performance requirements.

FIG. 15 shows the decomposed FR for the bolt tester example.

FIG. 21 illustrates the web-based user interface for the ecosystem client.

FIG. 24 summarizes the structure of a user interface consisting of three tab layers. The first layer lists the name of the design project or subsystem, the second layer the name of the design phase and the third layer the steps within a given design phase. This is a convenient, and yet efficient and generic, approach for guiding designers through design projects.

DETAILED DESCRIPTION OF THE PREFERRED EMBODIMENTS

1. Definitions

Table 1 captures the primary definitions and acronyms used in the patent.

TABLE 1

Summary of the primary definitions and acronyms.

| Name | Definition |
|---|---|
| AD | Axiomatic Design |
| ADMS | Autodesk Data Management Server |
| API | Application Program Interface |
| ASTM | American Society for Testing and Materials |
| CAD | Computer Aided Design |
| CAE | Computer Aided Engineering |
| CFD | Computational Fluid Dynamics |
| CPD | Collaborative Product Development |
| CSV | Comma-Separated Values |
| DF | Design Features |
| DM | Design Matrix |
| DP | Design Parameters |
| FEA | Finite Element Analysis |
| FR | Functional Requirement |
| GUI | Graphical User Interface |
| IP | Intellectual Property |
| IT | Information Technology |
| MRD | Market Requirement Document |
| OBJ | Objective |
| PDS | Product Design Specification |
| PI | Performance Indicator |
| PR | Performance Requirement |
| SAE | Society of Automotive Engineers |
| XML | Extensible Markup Language |

2. Best Mode of the Invention

FIG. 3-FIG. 5, FIG. 13, FIG. 17, FIG. 22-FIG. 23, FIG. 25 and FIG. 29-FIG. 33 capture the best mode contemplated by the inventors, according to the concepts of the present invention.

3. Optimization Framework for Concept Designs

Figure 1:
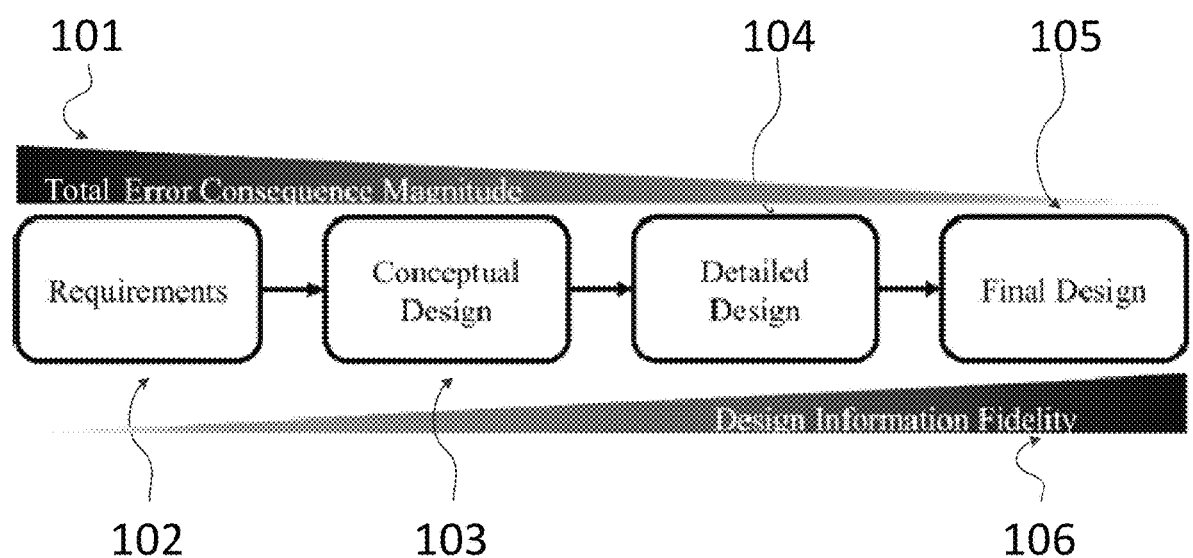
FIG. 1 presents a generic engineering design process, and highlights the significance of early identification for the purpose of minimizing the total error consequence magnitude and improving design information fidelity.
Figure 2:
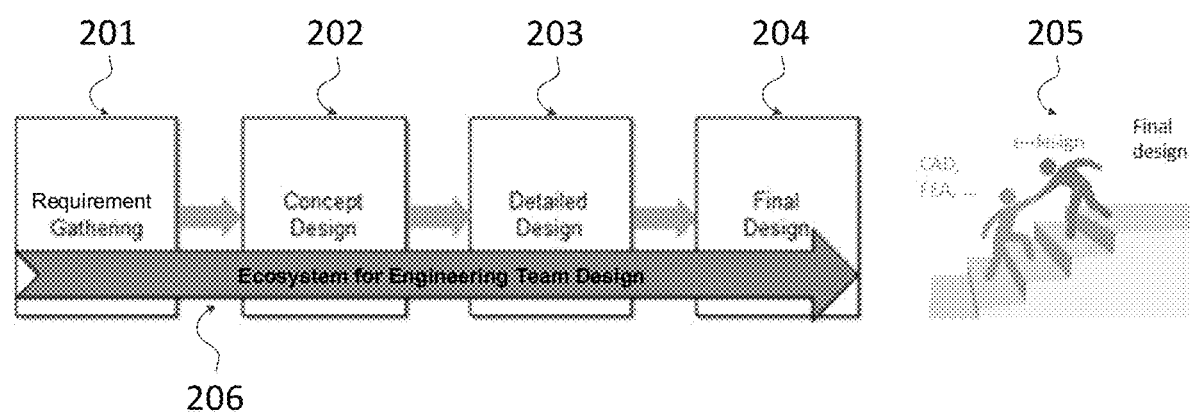
FIG. 2 defines the five stages comprising a design process and puts in perspective with the unique capabilities of the all-electronic ecosystem for engineering team design in terms of assessing the quality of design activities resulting from each stage. The concept of e-design is presented as a high-level framework, working with the existing design tools, and one that helps designers attain high-quality final designs in a timely fashion. Some design processes employ "Preliminary Design" or "Embodiment Design", in lieu of "Detailed Design". Same principles still apply.
Figure 3:
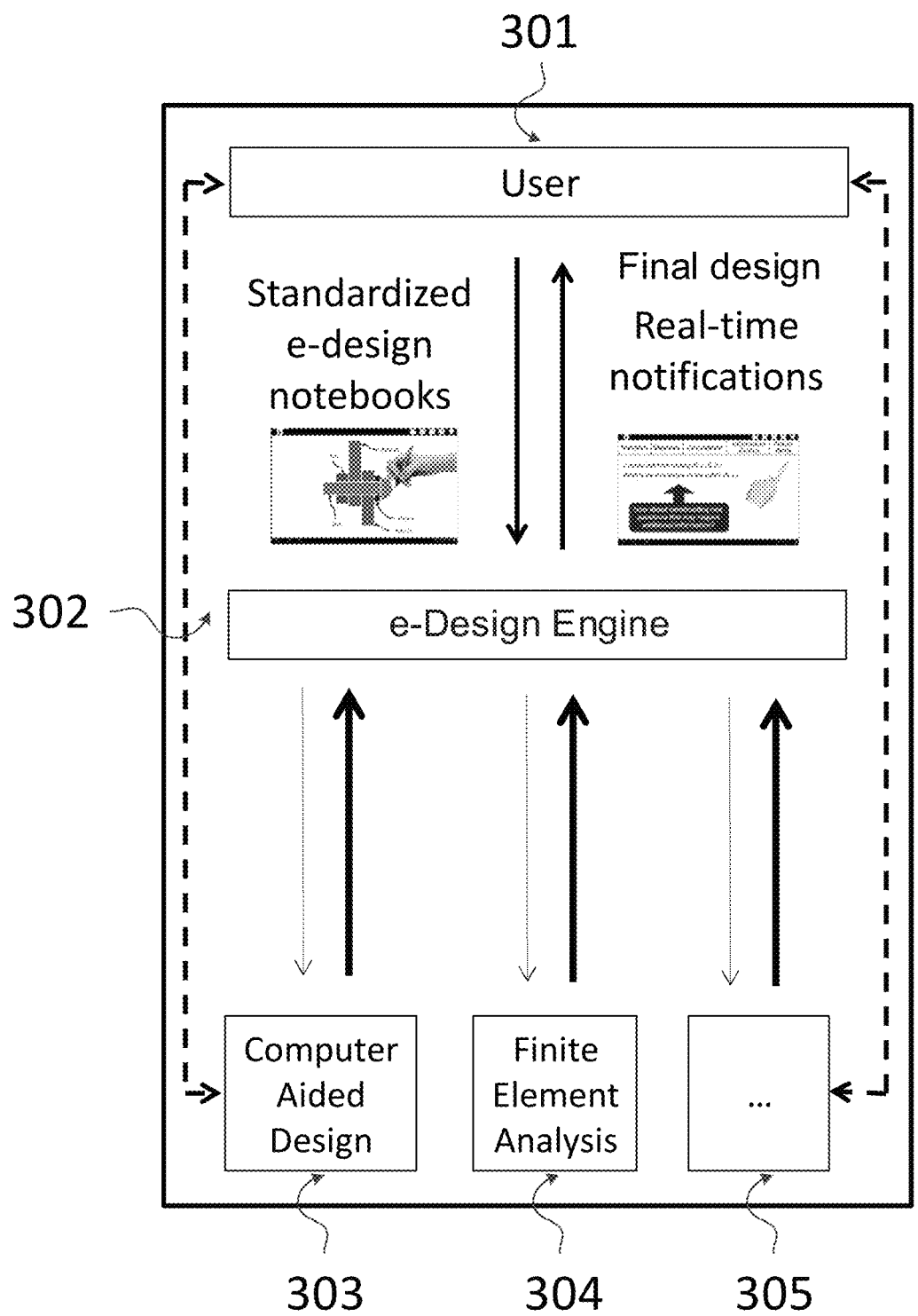
FIG. 3 presents the high-level architecture for the all-electronic ecosystem for engineering team design. The e-Design Engine conducts activities related to the design process at a level above the CAD, FEA or CFD tools. The user still can access existing engineering tools directly, if preferred.
Figure 4:
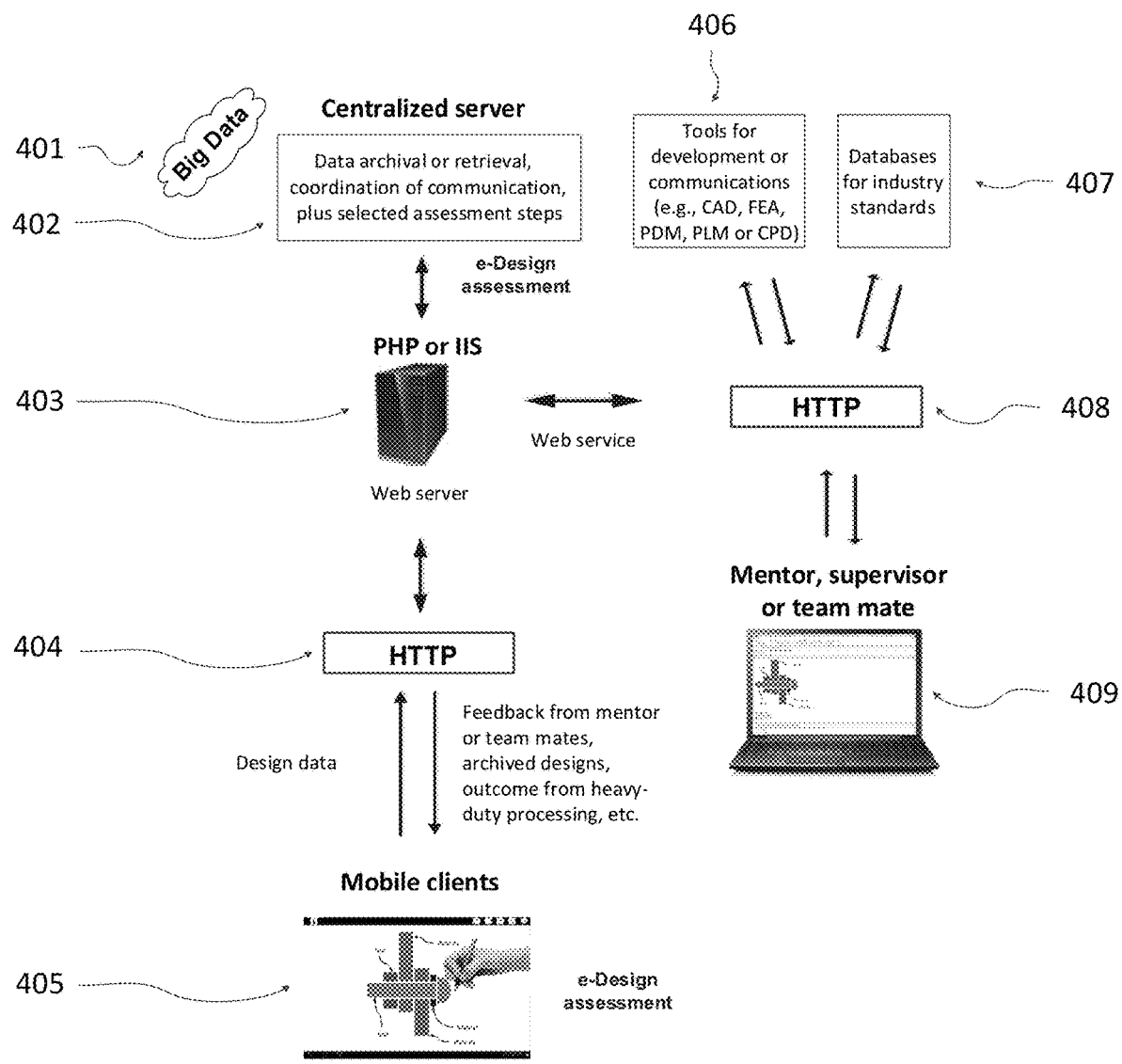
FIG. 4 presents a high-level architectural diagram for the all-electronic ecosystem for engineering team design, and puts in context with big data analytics.
Figure 5:
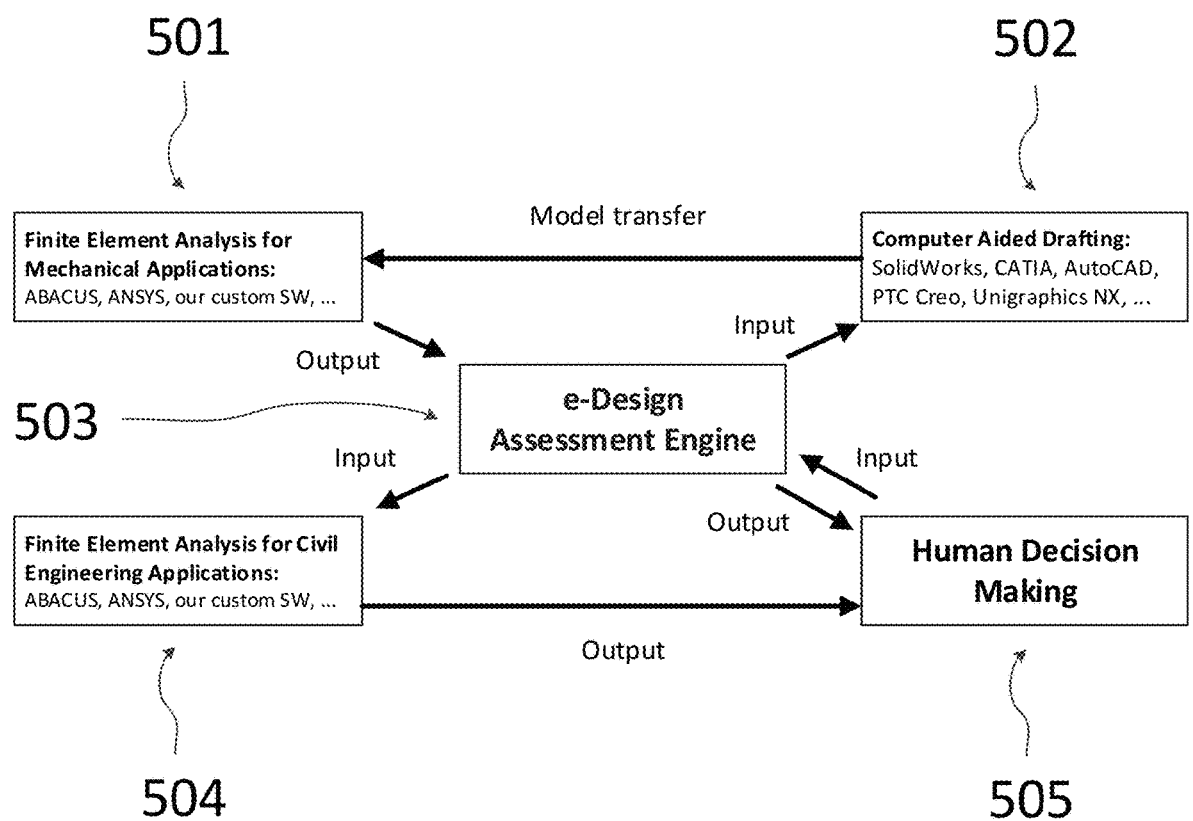
FIG. 5 provides further illustration of how the e-Design Assessment Engine interfaces with tools for Computer Aided Drafting or Finite Element Analysis, for the purpose of aiding human decision making.
Figure 6:
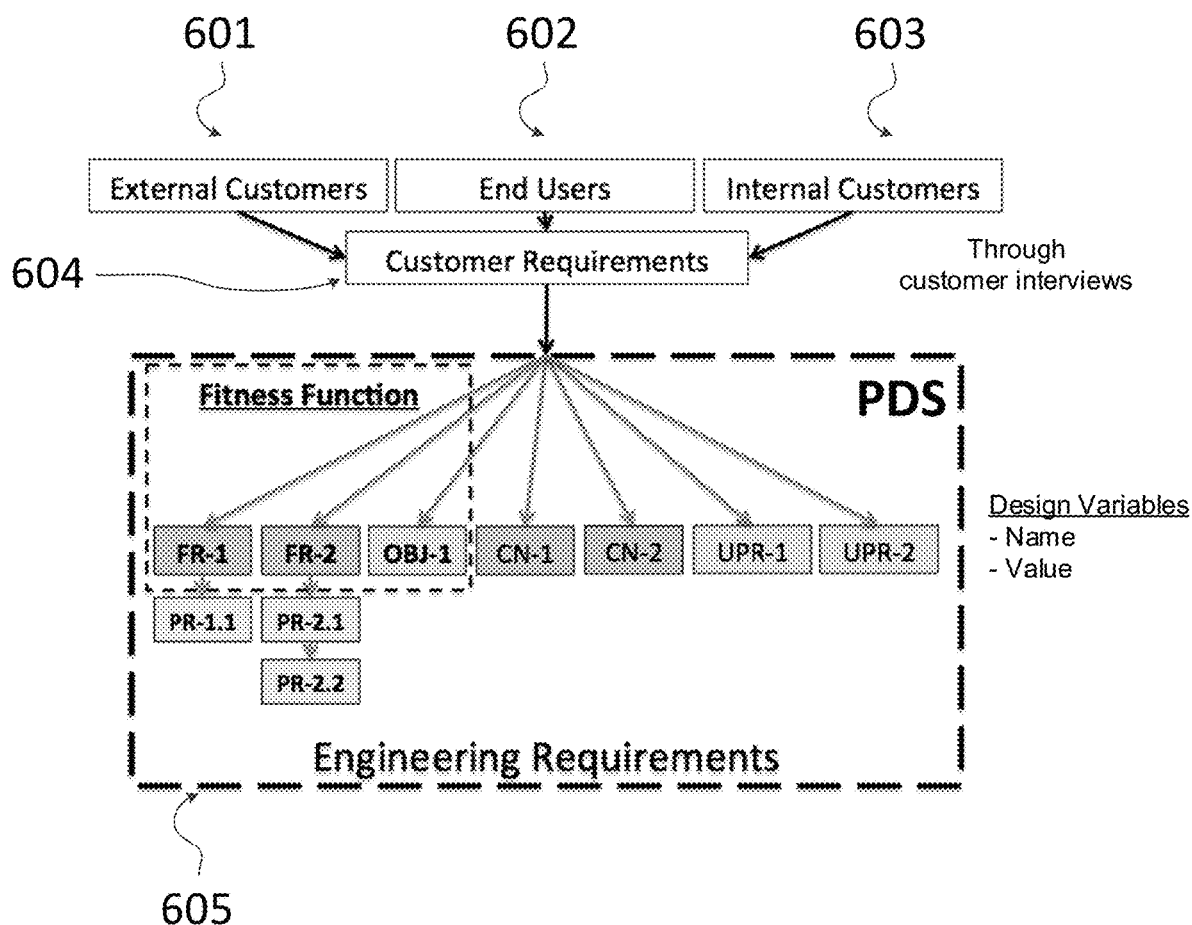
FIG. 6 shows PDS construction, one that includes analysis of the engineering requirements.

3.1 Generic Framework Accounting for the Importance (Priorities) Defined by the Customer FIG. 6 summarizes the generic optimization framework. All the different categories of global requirements are entered with an Importance factor, reflecting the associated priority, per customer definition. By default, the ecosystem assumes a power-law for the global fitness function:

$$\text{Fitness} = \sum_{i=1}^{n} \text{Requirement}[i]^{(Importance[i])} \quad (1)$$

Here, Requirement[i] refers to the designer's assessment of the suitability for the solution path under scrutiny as it applies to the ith requirement. Importance[i] refers to the relative importance of the ith requirement, again per customer definition.

While other forms of the objective functions can be employed, without deviating from the scope of the invention, Eq. (1) provides a generic approach for accounting both for the technical suitability of given concept solutions, with respect to given requirements, as well as the associated priority, per customer definition.

3.2 Axiomatic Design

Functional modeling extends from the PDS and fractures the design problem into smaller, and manageable sub-problems. Strict independence of each sub-problem is not required and significant interdependence will in fact be demonstrated in the example. But independence of FR remains a key notion in axiomatic design. FR are taken to be orthogonal, and the physical response to the FR and desired to follow suit (Suh 1990). In the ecosystem, the physical response is defined by design features (DF) and are the solution-space analog to qualitative FR in requirement-space. The analog to PR are quantitative design parameters (DP) which are defined as any manipulable specification of the DF that results in PR compliance. The relationship between FR and DF (and simultaneously between PR and DP) are the design equations, and the map between the two vector entities are design matrices [DM].

$$\{FR\} = [DM]_{qual.} \{DF\} \quad (2a)$$

$$\{PR\} = [DM]_{quant.} \{DP\} \quad (2b)$$

Eq. (2a) reflects the notion of a concept description. Eq. (2b) is instead the concept specification, and the vector {DP} is the design point. Eq. (2) requires some additional explanation. It is important to realize from the given relations there is no requirement to have equal number of DF and FR, or DP and PR. However, design quality is a referenced to the ideal state (Suh 1995). In accordance with the first of two succinct axioms, ideal designs are those that can be described by diagonal design matrices which ensure the complete independence of DP in relation to PR (the design is uncoupled). Here, the order in which the DPs are selected does not matter. Deficient but acceptable designs are described by triangular design matrices (the design is decoupled). For decoupled designs, the order in which the DPs are selected does matter. In the absence of rigorous mathematical treatment, the designer should strive to achieve a square design matrix with triangular properties at the minimum. The degree of coupling can be determined by analysis of the design matrix. The information axiom establishes that given two designs, the uncoupled design with the least amount of information is the best choice. Indeed, even the information axiom can be assessed in functional modeling. (Suh 1990), (Suh 1999) defines information content by I=2 log $p_i$ where $p_i$ is the probability of achieving the PR with DP, measured by the overlap region of the acceptable range of the DP with the overall range. The magnitude of information content in a design can be estimated from the number of instances of functional verbs and nouns multiplied by the logarithm of their respective category and summed in a linear combination (Sen 2010). Presuming that a less-rigorously defined function vocabulary contains only new verbs and nouns, the information content per PR can be estimated by $$I_{PR} \approx \log(N_{DP}/N_{PR}) \text{ bits.}$$

The total design information content can be estimated by $$I_{Des} \approx N_{PR} \log(N_{DP}/N_{PR}) \text{ bits.}$$

Figure 7:
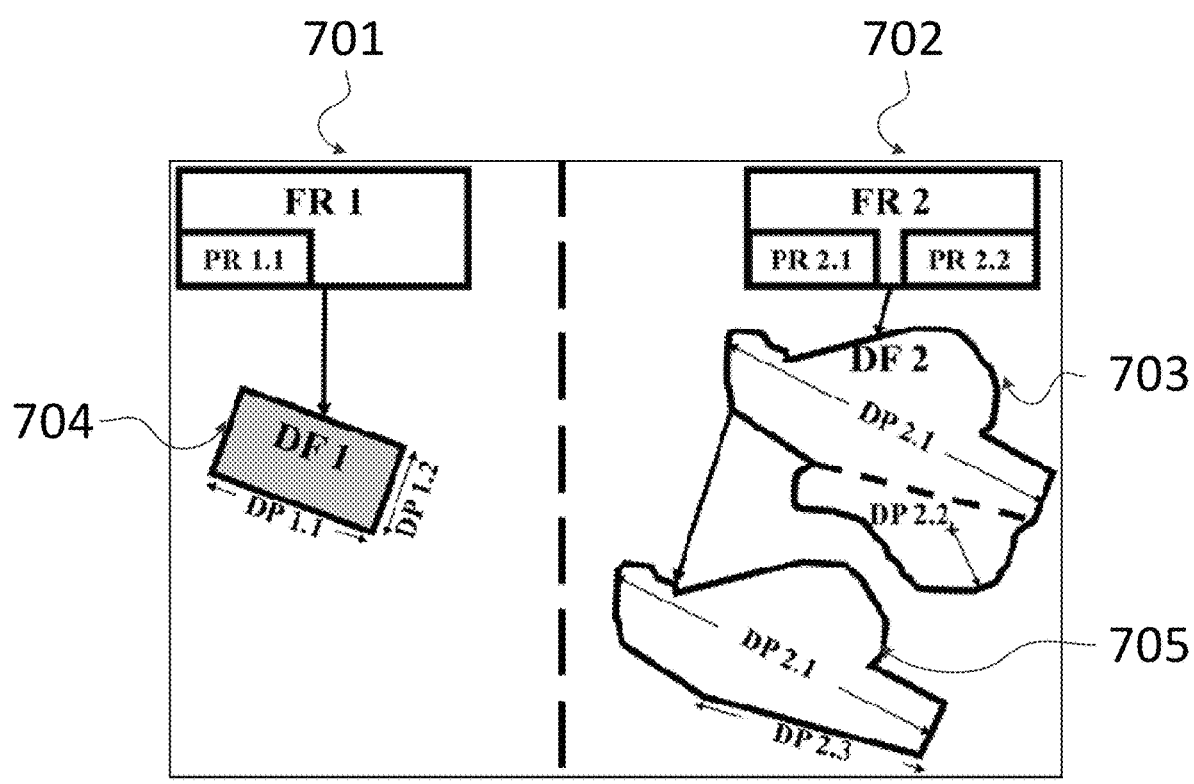
FIG. 7 shows functional model components for generic engineering PDS with two FR. The design to the left is insensitive to DP 1.2. DP 1.2 enters the objective function, but does not impact PR 1.1. For the design to the right, DP 2.3 is "geometrically" or "physically" dependent on DP 2.1 and DP 2.3. DP 2.3 does not impact the design (meaning PR 2.1 and PR 2.2), but does affect the objective function.
Figure 9:
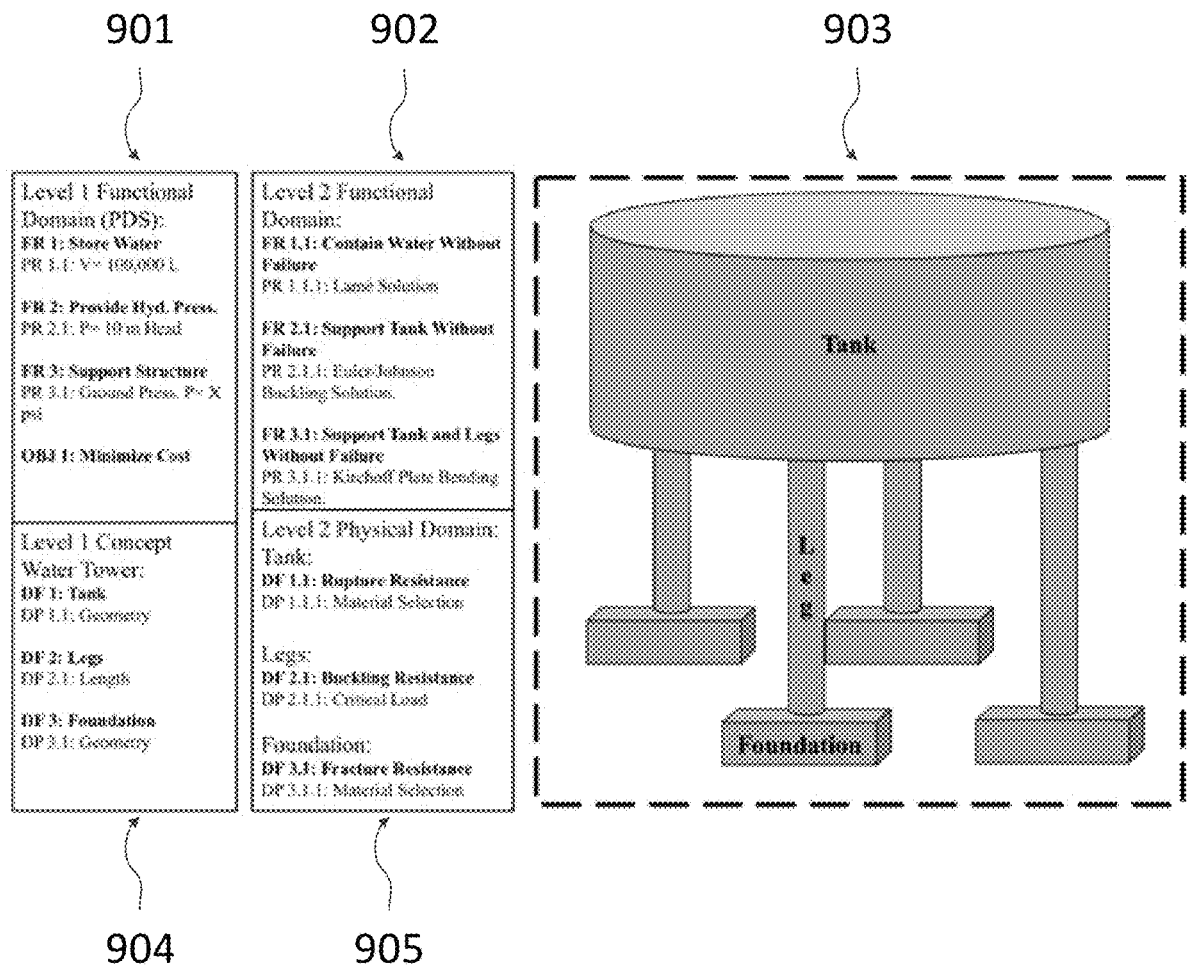
FIG. 9 shows a water tank design concept and a functionally decomposed model originating from a simplified PDS.

Axiomatic design matrix elements are defined as $A_{ijquant.} = \partial PR_i/\partial DP_j$. A triangular design matrix initiates from a square design matrix, and it is the stated goal of functional decomposition in the ecosystem to arrive at the design point with equal DP and PR. If the PDS in FIG. 6 is taken to be the starting point for a given design, then the first level of functional modeling should assign two distinct DF to satisfy the FRs, as depicted for an arbitrary problem in FIG. 7. The first DF may be interpreted as a single component or mechanical part, for instance. The second DF is intended to represent an assembly of two components. There is no requirement for the DF to contain a number of components equal to the number of PR associated with the FR and is coincidental (and simpler) in the case. The DP for DF 1 are parameters of the component that are manipulable by the designer. The relationship between PR and DP must be carefully chosen to enable representation in design matrix format (i.e., the PR must materialize as a linear combination of chosen DP). In DF 2, there are two independent parameters in the assembly that must be chosen to attain the PRs. However, a third DP is also necessary to specify to define the interface between the two components. In both cases, there are greater DP choices than PR, but a square representative design matrix is still possible. The remaining DP in either case can be specified not with reference to a PR (since no PR are sensitive to the outlier DP) but instead with reference to the OBJ specified. Typically, the OBJ can either be an overt specification of the engineering requirements, such as "minimize cost" as depicted in FIG. 9, or it can be a specific objective or fitness function of a direct optimization scheme as shown in the example.

$$\{PR1.1\} = [X]\{DP1.1\}$$

$$\begin{Bmatrix} PR2.1 \\ PR2.2 \end{Bmatrix} = \begin{bmatrix} X & 0 \\ 0 & X \end{bmatrix} \begin{Bmatrix} DP2.1 \\ DP2.2 \end{Bmatrix}$$

-continued $$DP2.3 = g(DP2.1, DP2.2)$$

$$OBJ1 = f(DP1.1, DP1.2, DP2.1, DP2.2, DP2.3)$$

Enforcement of triangular properties is challenging, but is influenced greatly by the selection of DP and in some cases can be effectively forced by approximation though sensitivity analyses. If multiple DP are presumed to affect a given PR, then those DP with the highest magnitude of effects are taken to be critical, whereas those with at least an order of magnitude less effect are marginalized.

3.3 Serial Optimization

Figure 8:
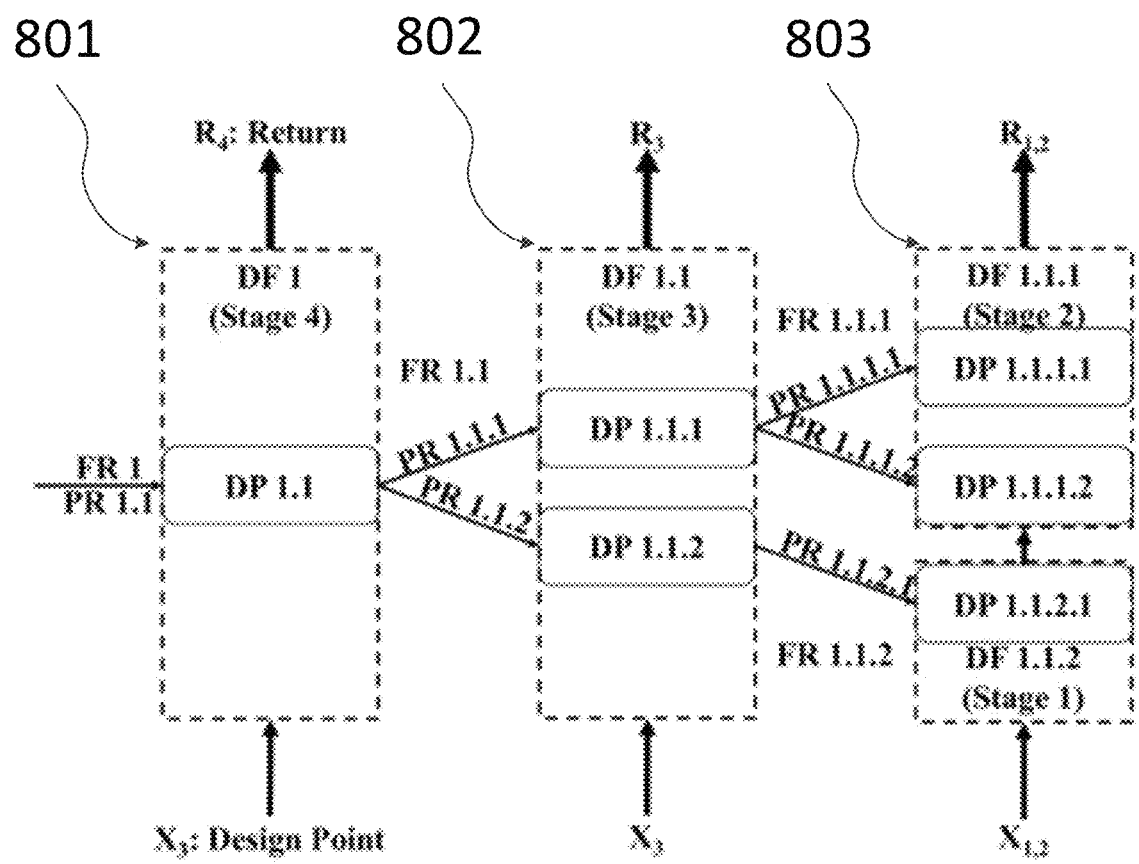
FIG. 8 outlines serialization of a function model for sub-optimization.

The principal of optimality applies to the process of sub-optimization. Combined, a serial multi-stage decision process can be optimized for the circumstances by sub-optimizing each stage. By nature, a functional model is not serial but can be serialized by treating each DF as an independent stage as depicted in FIG. 8. Note that the stage numbers (the subscripts of the design point decisions and return functions) are numbered in reverse-order for convenience.

The first stage in FIG. 8 has two simultaneous optimizations (each independent of the design point of the other). In this case, each should be sub-optimized prior to attempting to optimize stages 1 and 2 together. This independence of equal-level DF is not always the case. In many instances, equal-level DF reflect dependence on the design point of one another. This category of sub-optimization is addressed in the example. Using dynamic programming to optimize blocks of stages in succession, the optimal fitness of the ith stage can be expressed in terms of the ith return function (the objective evaluation at the ith-stage design point) and any previous optimal fitness obtained from earlier stages.

$$f_i^*(s_{i+1}) = opt_{Xi}[R_i(X_i, s_{i+1}) + f_{i-1}^*(X_i)] \quad (3)$$

The recurrence relationship of Eq. (3) limits dynamic programming to relatively small problems with few stages due to the computational effort (in terms of operations and memory required) for traditional linear programming problems with numerous constraints. Nonetheless, dynamic programming is an easy-to-grasp and implement optimization method that is capable of handling early conceptual development of small-scale designs. Dynamic programming in conceptual development is significantly enhanced by using the natural stage breakdowns of the functional model. A design example illustrating the functional model and dynamic programming follows.

3.4 Example: Water Tank

Functional modeling will be illustrated in the simplified conceptual design of a municipal water tank system for storage (Rao 2009). This functional model and concept sketch for this example is shown in FIG. 9. For simplicity and clarity, the optimization scheme and use of functional model entities is emphasized over the actual engineering analysis given here. This example is an initial value problem, since the beginning quantities (PR 1.1, PR 2.1, PR 3.1) are presumed to be known. Final and boundary value problems can be similarly treated by converting them into representative initial value problems through state inversion. It can be observed from level 2 decomposition terms in FIG. 9 that pertinent design equations are provided for each of the three DF of the system through specific PR. From examination of the functional model, it is clear that the decomposition shown exhibits ideality (diagonal design matrices) for each level of decomposition, both qualitatively and quantitatively. However, some creativity is required to do this, for example the level 2 DP 2.1.1 associated with buckling resistance incorporates both material and geometric parameters of DF 2.1. This combination of DP is acceptable owing to the fact that some parameters affecting it are selected via other means. Then, the remaining factors are selected through the following optimization scheme. The other means to obtain a suitable design matrix is to decompose into another level to sufficiently assign the DP to additional PR. This method may result in a triangular design matrix rather than a diagonal one.

For the concept presented, it would be easy to estimate the information content for comparison with competing models of equal decomposition. However, in this case, competing the design with others is not a concern, so further discussion of the information axiom's implications in this example are omitted.

As eluded to previously, the stages in this example progress from one equal-level DP to another. The order of succession must be chosen carefully from the language of the appropriate PR. Nothing that the foundation must support the entire structure without failure, it is the component upon which no others depend, and can be deemed stage 1. Secondly, the legs rest atop the foundation but must support the tank and the water, so is the next stage (dependent only on the design point of itself and the succeeding stage). That last successive stage is the tank itself, which must support nothing but the load from the water. The stage performance s, can be related to the current stage design point and the next stage performance $s_i=DF_i(X_i,s_{i-1})$.

From the simplified PDS in the top left-hand corner of FIG. 9, the OBJ is stated simply as "minimize cost". Presume that stage cost is taken as the return value $R_i(X_i, s_{i+1})$, a "quality" measure. Eq. (3) implies the first stage optimal fitness can be obtained by minimizing the return value for any given second-stage performance value.

$$f_1^*(s_2)=\min_{X1}[R_1(X_1,s_2)]$$

Similarly, the second stage optimal fitness incorporates first stage fitness and can be expressed as a function of the previously determined $f_1^*$ and its own stage return. Likewise for the third stage.

$$f_2^*(s_3)=\min_{X2,X1}[R_2(X_2,s_3)+R_1(X_1,s_2)]$$

$$f_3^*(s_4)=\min_{X3,X2,X1}[R_3(X_3,s_4)+R_2(X_2,s_3)+R_1(X_1,s_2)]$$

A simple substitution of the expression for, $f_2^*$ and $f_1^*$ can simplify the equation for $$f_3^*(s_4)=\min_{X3}[R_3(X_3,s_4)+f_2^*(s_3)+f_1^*(s_2)]$$

In this manner the utility of sub-optimization becomes apparent.

Figure 10:
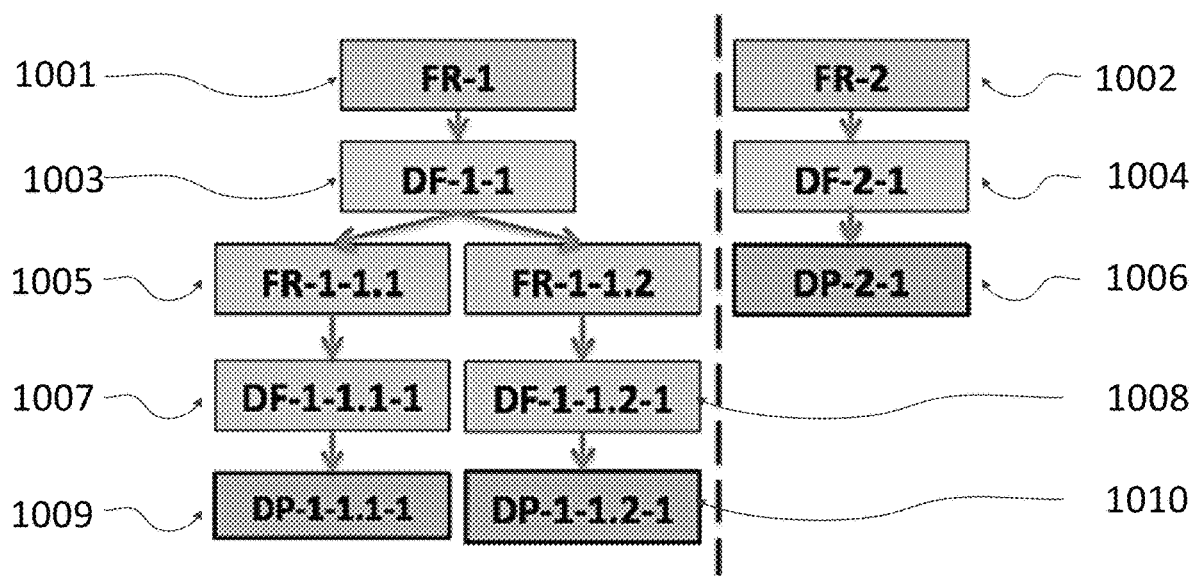
FIG. 10 depicts at a high-level the PDS modification and a simultaneous concept development process.

Each of the above stages exists on the same level of decomposition. Each level can also be declared independent stages to be sub-optimized in the same manner as shown above. Then the fourth stage is taken to be the optimization of the most dependent DF on the presiding level (for example, DF 3, where DP 3.1 is known to depend on overall structure weight, determined in stage 3 optimization). Similar to the generic functional model case illustrated in FIG. 10, DF 1 and 2 can be optimized simultaneously as stage 5 as their design points are deemed independent of one another.

Many other manners exist with which to construct meaningful functional models and effective optimization schemes. The curse of dimensionality that accompanies the dynamic programming in the example can be overcome by implementing genetic algorithms. Genetic algorithms have the added benefit of being able to deal with discrete and continuous design parameters (such as commercial off-the-shelf component options). In the genetic scheme, sub-optimization stages can be defined without independently addressing each DF. In some cases, it may be suitable to optimize the entire functional model in one stage using a fitness function relating each decomposition level return function.

While the ecosystem is intended to be generic to accommodate designer preference, additional efforts will be expended to include rigorously-defined functional vocabularies and relationship such as the one proposed by (Sen 2011). Doing so increases not just the utility to the designer, but allows extended automation of basic design checking including conformance with basic scientific principles. The functional model is a key fundamental logic tool, and can be used not only for discerning ideality and optimality, but also for team organization.

3.5 Local Vs. Global Requirements

Figure 11:
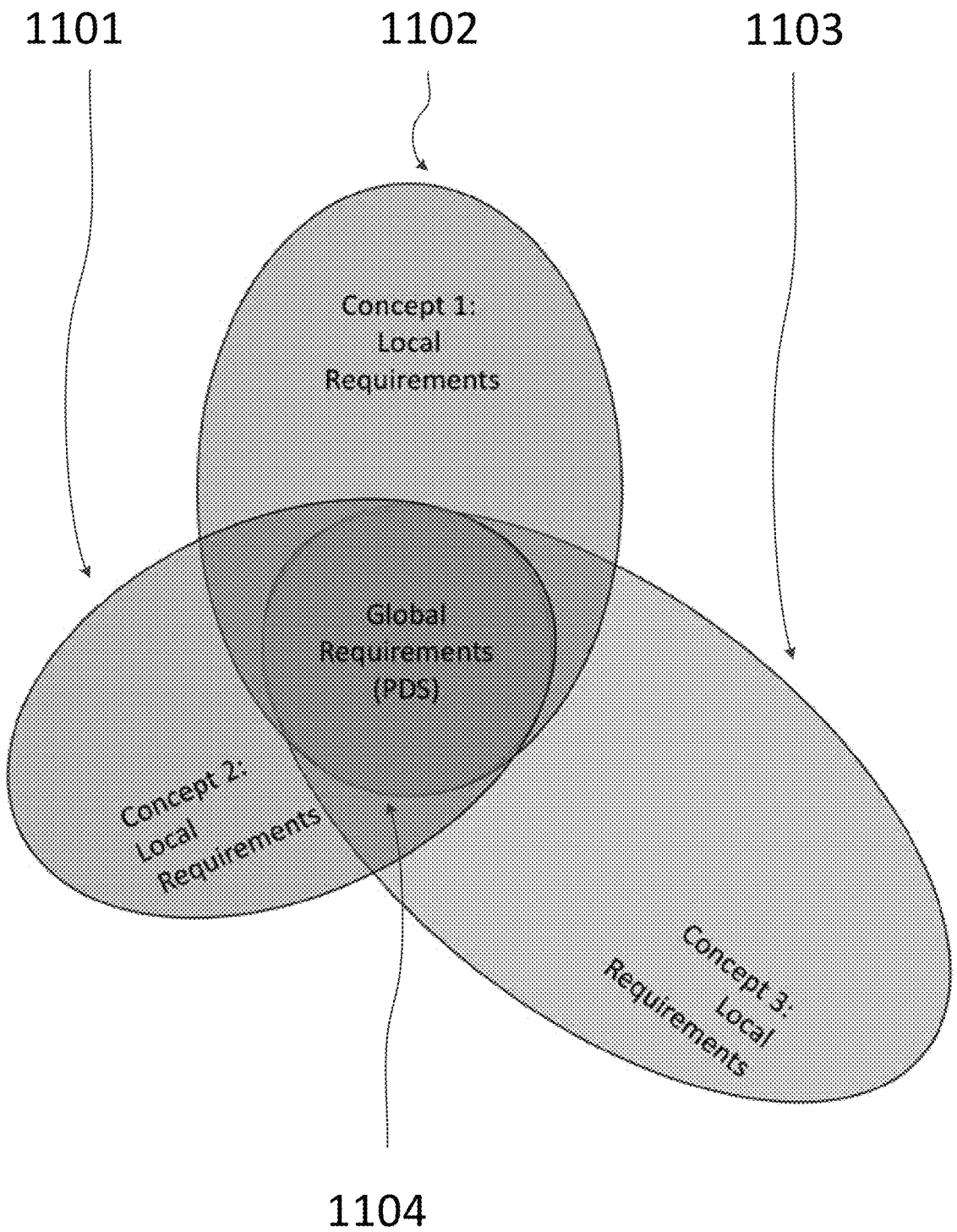
FIG. 11 provides graphical depiction of the association of local requirements with the global requirements listed in the PDS.

Global requirements defined in the PDS lead the designer to develop concepts in accordance with established priorities. Concepts are matured in the ecosystem by mapping physical design features (DF) to each FR. Both FR and DF are systematically decomposed, until sufficient fidelity is obtained to make informed decisions on the most fruitful path. Concept decomposition results in a set of local requirements that apply to the specific concept under development. DF reveal additional FR in accordance with their solution principles. A depiction of the relationship between the local requirements for three independent, general concepts and the established global requirements is presented in FIG. 11.

Objective function evaluations are not only useful for first tier (concept) selections. At each stage of decomposition, it is expected that multiple options might exist as DF for locally established FR. An identical procedure can be used to weigh each option for maximum effectiveness.

4. How to Make the Invention

4.1 Decomposition of PDS and Comparison with Concept Design Entities at Equal Tiers Within the ecosystem, functional modeling decomposes a design problem into several lesser design problems. Concept-specific FRs, and the representative solution paths are outlined in the form of a design tree. The solution paths are formulated as design features which act as macro-scale binders for the discrete design parameters. The hierarchical decomposition of the functional model continues until parallel fundamental problems are determined which can be solved by basic solution principles. The basic solution principles are drawn from Systematic Design. Axiomatic Design principles identify the relationship between parallel problems. Functional modeling is given high priority for the enforcement of rules in AD.

Figure 12:
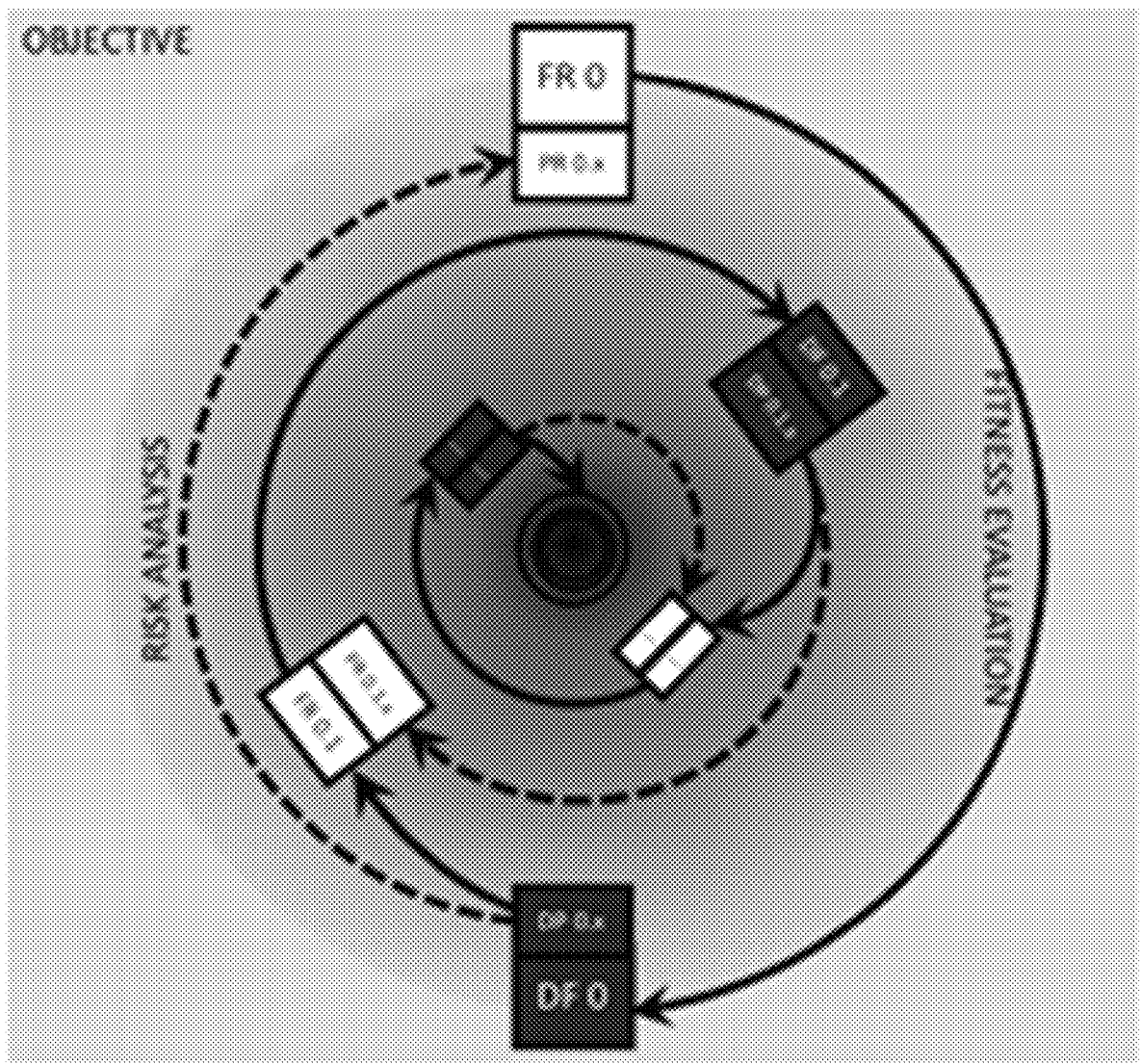
FIG. 12 shows the continuous and simultaneous analysis of risks (PRs and Constraints) and functional decomposition, for the next level of concept development.

FIG. 12 shows the continuous and simultaneous analysis of risks (PRs and Constraints) and functional decomposition (for the next level of concept development). It shows the outer ring of a helix being initiated by FR 0, and its subordinate PRs. Ideation commences to develop the DFs from which DP are identified. The FR and OBJ make up the qualitative fitness function that assists the designer in evaluating design paths for suitability. The DPs then are checked for compliance with the risks (PRs and constraints) and the DF/PR establishes the next level of decomposition. This process continues until the design has sufficient information to validate all risk factors identified. The lower level risk factors are identified in a cascade manner dependent on higher level design choices.

4.2 Automatic Assessment of Design Work, for Each Stage in the Design Process, Against Outcomes (Learning Outcomes)

Here we show that a software application, specifically, the ecosystem, can indeed be used to assess and evaluate outcomes of an entire design process. The outcomes are defined in terms of learning outcomes, i.e., as the skills that students, or practicing engineers, are expected to demonstrate at the end of a design project. We focus on the following learning outcomes:
1. The user shall have the "ability to evaluate information and incorporate into the design".
2. The user shall function as part of a team.
3. The user shall communicate in the language of design.
4. The user shall define, perform, and manage the steps of the design process.

Assessment of the design work against the outcomes is accomplished as listed below:
1. We identify the core characteristics of the learning outcomes.
2. We identify established performance indicators and correlate them both with the outcomes and phases in the design process.
3. We construct rubrics to assess the performance indicators.
4. For any given design phase, we score the design work against the rubric associated with that phase.

Successful implementation hinges on the ability to construct rubrics that can assess the performance indicators and which also can be evaluated automatically (in software). This usually requires usage of countable, or even binary, criteria.

Defining the Core Characteristics of the Learning Outcomes

The core characteristics of the learning outcomes are specified in Table 2.

Identifying Accepted Performance Indicators and Associating Them with the Design Phases and the Learning Outcomes The performance indicators (PIs) adopted are defined in The Information Literacy

TABLE 2

Core characteristics of the learning outcomes identified.

| Learning Outcome | Core Characteristic |
| --- | --- |
| Ability to evaluate information and incorporate into design | The ability to determine the nature and extent of information needed, access that information effectively and efficiently, critically evaluate the information and sources, and use information effectively to accomplish a specific purpose. |
| Designer functions as part of a team | The ability to collaborate and communicate effectively to complete deliverables in each phase. |
| Designer communicates in the language of design | The ability to generate and manage all types of knowledge representations (graphical, symbolic, algorithmic, textual) to communicate design products and efforts. |
| Designer defines, performs and manages the steps in the design process | The ability to logically progress in each phase by completing design efforts contributing to deliverables. |

Competency Standards for Higher Education (Library 2000). These Information Literacy Competency Standards were approved by the Board of Directors of the Association of College and Research Libraries on Jan. 18, 2000, and endorsed by the American Association for Higher Education in October, 1999, and by the Council of Independent Colleges in February, 2004. Hence, they are considered widely accepted.

In Table 3, the correlation between the performance indicators and the core characteristics in Table 2 is denoted as high (H), medium (M) and low (L). While each performance indicator could provide pertinent evidence for the entire collection of specified outcomes, throughout the ecosystem, only indicators with high degree of correlation contribute to the respective assessments.

Manual Evaluation of the Performance Indicators on Basis of a Rubric with Metrics For the performance indicators listed in Table 3, we developed a concise rubric with metrics to be used for evaluating the performance indicators. For the content listed in (Notebooks 2015), manual evaluation of performance indicators, in accordance with established metrics, allowed determination of a numerical representation for each desired learning outcome. Table 4 illustrates the manual evaluation of the PIs, for the case of the Detailed Design phase.

TABLE 3

Established performance indicators and their correlation with the design phases and learning outcomes.

| Performance Indicator | Phase | | | | Outcome | | | |
|---|---|---|---|---|---|---|---|---|
| | RG | CD | DD | FD | 1 | 2 | 3 | 4 |
| Standard 1: Determines the nature and extent of information needed | | | | | | | | |
| Defines and articulates the need for information | H | H | H | H | H | H | H | H |
| Identifies a variety of types and formats of potential sources for information | H | M | H | L | H | H | H | H |
| Considers the costs and benefits of acquiring the needed information | L | M | H | H | H | M | L | H |
| Reevaluates the nature and extent of the information need | M | H | H | M | H | L | L | H |
| Standard 2: Accesses needed information effectively and effciently | | | | | | | | |
| Selects the most appropriate investigative methods or information retrieval systems for accessing the needed information | M | M | H | M | H | L | L | M |
| Extracts, records, and manages information and its sources | H | H | H | H | H | H | H | H |
| Standard 3: Evaluates information and its sources critically and incorporates selected information into his or her knowledge base and value system | | | | | | | | |
| Summarizes the main ideas to be extracted from the information gathered | H | H | H | H | H | L | H | M |
| Articulates and applies initial criteria for evaluating both the information and its sources | H | H | H | H | H | M | M | H |
| Synthesizes main ideas to construct new concepts | H | H | M | L | H | H | H | H |
| Compares new knowledge with prior knowledge to determine the value added, contradictions, or other unique characteristics of the information | L | H | H | M | H | M | M | H |
| Determines whether the new knowledge has an impact on the individual's value system and takes steps to reconcile differences | H | H | H | M | H | H | L | H |
| Validates understanding and interpretation of the information through discourse with other individuals, subject-area experts, and/or practitioners | H | H | H | H | H | H | L | M |
| Determines whether the initial query should be revised | H | H | H | M | H | H | L | H |
| Standard 4: Uses information effectively to accomplish a specific purpose | | | | | | | | |
| Applies new and prior information to the planning and creation of a particular product or performance | L | H | H | H | H | M | H | H |
| Revises the development process for the product or performance | M | M | M | H | H | M | M | H |
| Communicates the product or performance effectively to others | H | H | H | H | H | H | H | H |
| Standard 5: Understands many of the economic, legal, and social issues surrounding the use of information and accesses and uses information ethically and legally | | | | | | | | |
| Acknowledges the use of information sources in communicating the product or performance | H | M | H | M | H | L | H | L |

TABLE 4

| Performance Indicator | Outcome | | | | Performance Assessment | | | |
|---|---|---|---|---|---|---|---|---|
| | 1 | 2 | 3 | 4 | Beginning | Developing | Developed | Accomplished |
| Defines and articulates the need for information | X | X | X | X | Few (<25%) risk factors have complete assignments | Some (25%-50%) risk factor have complete assignments | Many (50-75%) risk factors have complete assignments | Most (>75%) risk factors have complete assignments |
| Identifies a variety of types and formats of potential sources for information | X | X | X | X | No solid model, no methods specified for analysis | No solid model, at leadr 1 analysis method specified for some analysis | Solid model created, at least 1 method specified for few (<25%) analysis | Solid model created, at least 1 method specified for few (25-50%) analyses |
| Reevaluates the nature and extent of the information need | X | | | X | Analyses completed supprt no | Analyses completed support few | Analyses completed support some | Analyses completed support some |
| Determines whether the initial query should be revised | X | X | | X | decomposed FRs | (<25%) decmposed FR | (25-50%) decmposed FRs | (50-75%) decmposed FRs |
| Selects the most appropriate investigative methods or information retrieval systems for accessing the needed information | X | | | | No methods selected for analyses | Few (<25%) have methods selected | Some (25-50%) analyses have methods selected | Many (50-75%) analyses have methods selected |

TABLE 4-continued

| Performance Indicator | | | | | | | | |
|---|---|---|---|---|---|---|---|---|
| Extracts, record and manages information and its sources | X | X | X | X | No analyses with graphical and/or textual support | Few (<25%) analyses with graphical and/or textual support | Some (25-50%) analyses with graphical and/or textual support | Many (50-75%) analyses with graphical and/or textual support |
| Summarizes the main ideas to be extracted from the information gathered | X | | X | | No requirements verified | Few (<25%) requirements verified | Some (25-50%) requirements verified | Many(50-75%) requirements verified |
| Articulates and applies initial criteria for evaluating both the information and its sources | X | | | X | | | | |
| Compares new knowledge with prior knowledge to determine the value added, contradictions, or other unique characteristics of the information | X | | | X | At least 1 critical flaw identified which requires concept fitness reconsideration | At least 1 scrious flaw identified which requires FR or DF revision | At least 1 major flaw identified which requires DP revision | Only minor flaws identified which require DP manipulation |
| Determines whether the new knowledge has an impact on the individual's value system and takes steps to reconcile differences | X | X | | X | | | | |
| Validates understanding an interpretation of the information through discourse with other individuals, subject area experts, and/or practitioners | X | X | | | Members have not communicated within the habitat | 1 member has attempted to establish thread communication | Members have established communication thread with some members participating (<50%) | Members have established communication thread with most members participating (>50%) |
| Applies new and prior information to the planning and creation of a particular product or performance | X | | X | X | No DP settings justified by analysis | Few (<25%) DP settings justified by ana;ysis | Some (25-50%) DP settings justified by analysis | Many (50-75%) DP settings justified by analysis |
| Communicates the product or performance effectively to others | X | X | X | X | Few (<25%) results communicated appropriately | Some (25-50%) results communicated appropriately | Many (50-75%) results communicated appropriately | Few (>75%) results communicated appropriately |
| Acknowledge the use of information sources in communicating the product or performance | X | | X | | No analysis methods cited | 1 analysis method cited | Some (<50%) analysis methods cited | Most (>50%) analysis methods cited |

| Performance Indicator | Performance Assessment Exemplary | Outcome Binary | | | |
|---|---|---|---|---|---|
| | | 1 | 2 | 3 | 4 |
| Defines and articulates the need fr information | All risk factors have complete assignments | 1 | 1 | 1 | 1 |
| Identifies a variety of types and formats of potential sources for information | Solid model created, at least 1 method specified for few (>75%) analysis | 1 | 1 | 1 | 1 |
| Reevaluates the nature and extent of the information need | Analysis completed support some (>75%) decmposed FRs | 1 | 0 | 0 | 1 |
| Determines whether the initial query should be revised | | 1 | 1 | 0 | 1 |
| Selects the most appropriate investigative methods or information retrieval systems for accessing the needed information | Most (>75%) analoyses have methods selected, of at least 2 types | 1 | 0 | 0 | 0 |
| Extracts, record and manages information and its sources | Most (>75%) analyses with graphical and/or textual support | 1 | 1 | 1 | 1 |

TABLE 4-continued

| | | | | | |
|---|---|---|---|---|---|
| Summarizes the main ideas to be extracted from the information gathered | Most (>75%) requirements verified | 1 | 0 | 1 | 0 |
| Articulates and applies initial criteria for evaluating both the information and its sources | | 1 | 0 | 0 | 1 |
| Compares new knowledge with prior knowledge to determine the value added, contradictions, or other unique characteristics of the information | No flaws identified which require changes | 1 | 0 | 0 | 1 |
| Determines whether the new knowledge has an impact on the individual's value system and takes steps to reconcile differences | | 1 | 1 | 0 | 0 |
| Validates understanding an interpretation of the information through discourse with other individuals, subject area experts, and/or practitioners | Members have established communication thread with at least 1 post from each | 1 | 1 | 0 | 0 |
| Applies new and prior information to the planning and creation of a particular product or performance | Most (>75%) DP settings justified by analysis | 1 | 0 | 1 | 1 |
| Communicates the product or performance effectively to others | All results communicated appropriately | 1 | 1 | 1 | 1 |
| Acknowledge the use of information sources in communicating the product or performance | All analysis methods cited | 1 | 0 | 1 | 0 |
| Subtotal: | | 56 | 31 | 28 | 38 |
| Possible: | | 70 | 35 | 35 | 45 |
| Performance: | | 0.8 | 0.89 | 0.8 | 0.84 |

For the manual scoring in Table 4, the following procedure is applied to evaluate of the learning outcomes:

1. For any given learning outcome and a given performance indicator, $$OutcomeBinary(Outcome, PI) = \begin{cases} 1, & \text{if } PI \text{ exhibits high degree of correlation with Outcome in Table 3} \\ 0, & \text{otherwise} \end{cases}$$

2. For any given learning outcome, the Subtotal is obtained as $$Subtotal(Outcome) = \Sigma_{PIs} OutcomeBinary(Outcome, PI) * PerformanceAssessment(PI)$$

Here, PerformanceAssessment (PI) is evaluated in accordance with the bold squares in Table 4:

$$PerformanceAssessment(PI) = \begin{cases} 5, & \text{if } PI \text{ evaluated as Examplary} \\ 4, & \text{if } PI \text{ evaluated as Accomplished} \\ 3, & \text{if } PI \text{ evaluated as Developed} \\ 2, & \text{if } PI \text{ evaluated as Developing} \\ 1, & \text{if } PI \text{ evaluated as Beginning} \end{cases}$$

3. The highest score possible (Possible) is determined as $$Possible(Outcome) = \Sigma_{PIs} OutcomeBinary(Outcome, PI) * (Maximum\ Score(=5))$$

4. The Performance is then simply assessed as $$Performance(Outcome) = \frac{Subtotal(Outcome)}{Possible(Outcome)}$$

In accordance with the results in Table 4, learning outcome 1 is attained at the 80% level, outcome 2 at the 89% level, outcome 3 at the 80% level, and outcome 4 at the 84% level.

Guiding Alerts Corresponding to the Rubric Elements

We associate a guiding alert to each rubric element. The guiding alerts corresponding to the rubric in Table 4, for the detailed design phase, are presented in Table 5

It should be emphasized that while we have attempted to automate the e-design notebooks as much as possible, for example by providing auto-population of tabs and automatic exporting of the design notebooks into formatted text files, we have been very careful about not 'dumbing down' the learning experience. As we craft the alert messages, we remain cognizant of the following tenants:
1. Each alert message should contain the maximum information content possible (be as specific as possible).
2. To minimize confusion, each alert should formulate a clear request, or suggestion, to the user.
3. When possible, the alerts should contain language aimed at nurturing the problem solving capabilities and the high-level design thinking of the user.

Figure 16:
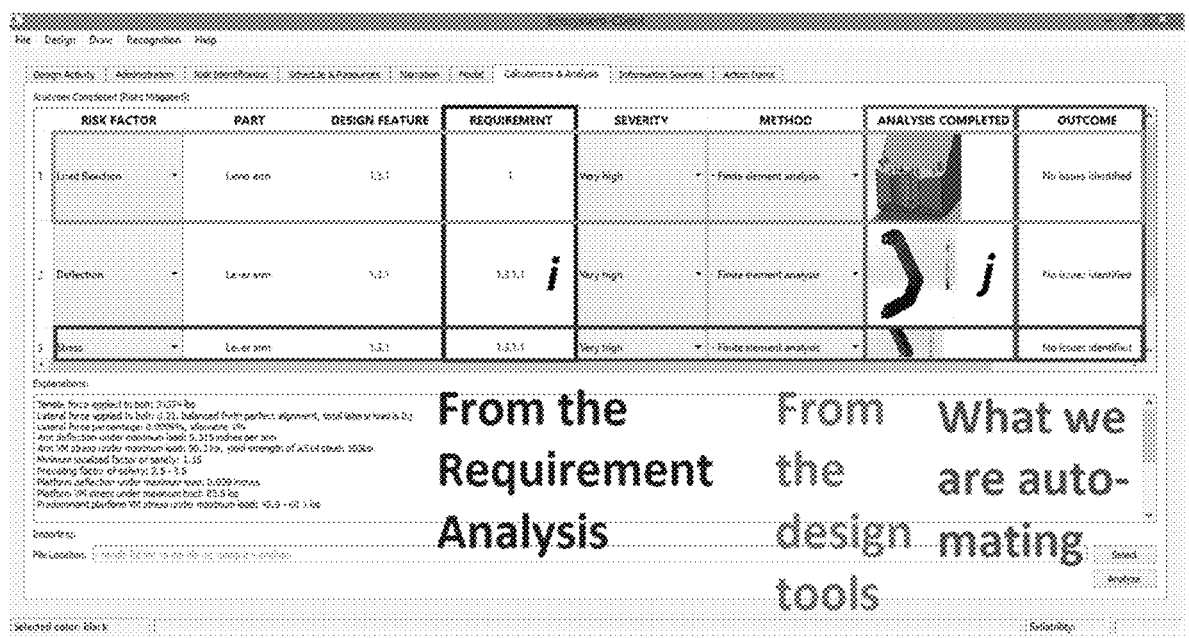
FIG. 16 outlines the association between specific requirements (i) and particular analyses (j), for given risk factors.
Figure 17:
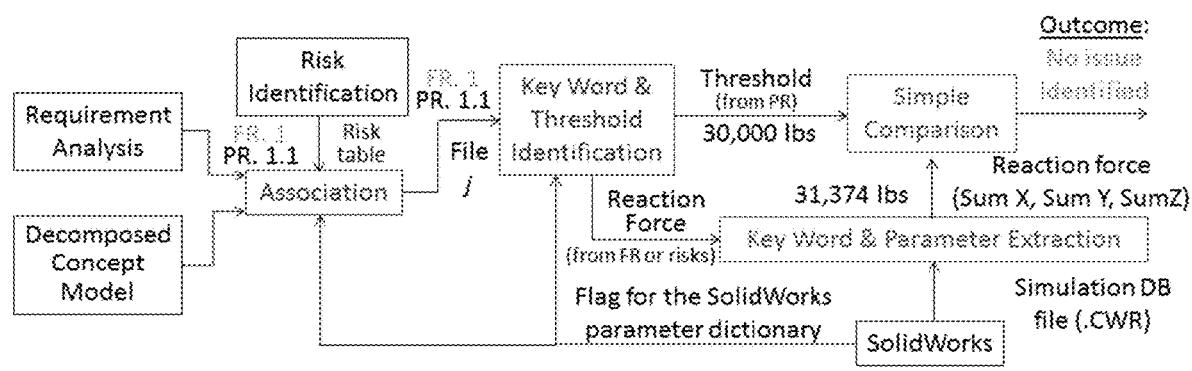
FIG. 17 presents an example of automated assessment of requirement compliance for load reaction of a lever arm. For insight into the Association function, refer to FIG. 16.

We try to be quite careful in terms how we phrase the alert messages, because we believe much of the benefits offered by the ecosystem is, and will be, delivered through these messages.

design team and identified in the Calculation & Analysis and Risk Identification tabs of the ecosystem. The Risk Identification tab, shown in FIG. 16, compiles all applicable requirements. The Association step associates requirements corresponding to risk items whose severity exceeds a given, configurable threshold.

The output files, from which requirement verifications are made, result from the post-processing phase of CAE tasks. Typically, post-processing collects solution information and formats an output file sufficient for direct use, visualization, or further manipulation. Table 6 and Table 7 address the structure of the Decoder and the scripting repository, for popular CAD, FEA and CFD design tools. In case of SolidWorks, which relies on structured storage, the Decoder may utilize a portable C++ library called POLE (POLE 2015). Consistent with the guidelines offered during the functional decomposition (Manual 2015), we emphasize

TABLE 5

Excerpt from the alerts for the detailed design phase, corresponding to the rubric in Table 4.

| Performance Indicator | Outcome | | | | Performance Assessment | | | | |
|---|---|---|---|---|---|---|---|---|---|
| | 1 | 2 | 3 | 4 | Beginning | Developing | Developed | Accomplished | Exemplary |
| Defines and articulates the need for information | X | X | X | X | "For [Risk Factor IDs], complete the assignment line-items" | "For [Risk Factor IDs], complete the assignment line-items" | "For [Risk Factor IDs], complete the assignment line-items" | "For [Risk Factor IDs], complete the assignment line-items" | "All risk factors are accounted for, are there additional risks to consider?" |
| Identifies a variety of types and formats of potential sources for information | X | X | X | X | "No solid model has beencreated and no methods havebeen specified for analysis, add a model and analysis methods." | "No solid model has been creaed, add a model and analysis method for [risk factor IDs]." | "Add analysis method(s) for [risk factor IDs]." | "Add analysis method(s) for [risk factor IDs]." | "Add analysis method(s) for [risk factor IDs]." |
| Reevaluates the nature and extent of the information need | X | | | X | "Risk factors do not reference any decomposed FRs." | "Risk factors only reference [FR IDs]. Add analysis to consider remaining FRs." | "Risk factors only reference [FR IDs]. Add analysis to consider remaining FRs." | "Risk factors only reference [FR IDs]. Add analysis to consider remaining FRs." | "Risk factors only reference [FR IDs]. Add analysis to consider remaining FRs." |
| Determines whether the initial query should be revided | X | X | | X | | | | | |

4.3 e-Design Assessment Engine: Automatic Requirement Verification

Structure of the e-Design Assessment Engine

Figure 13:
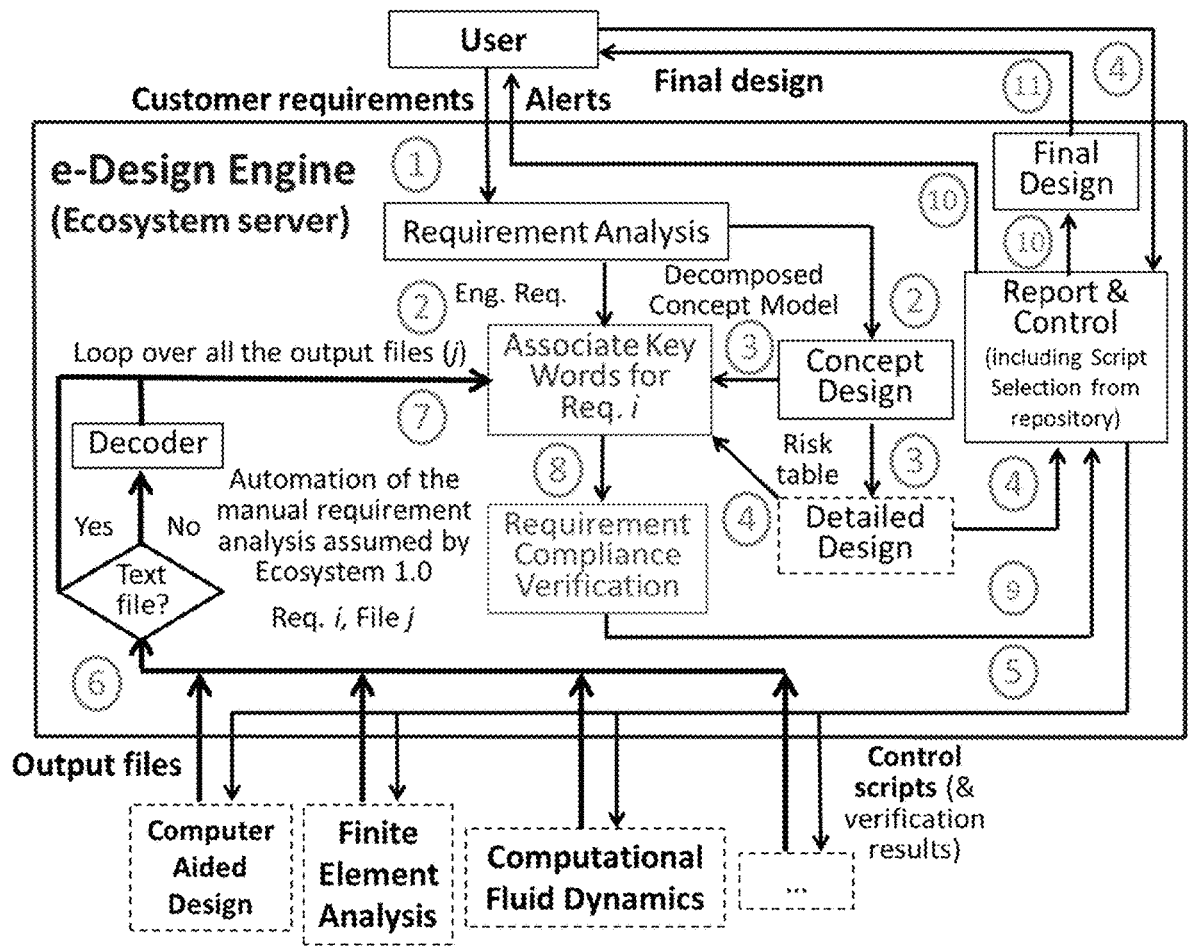
FIG. 13 captures the internal structure of the e-Design Assessment engine in FIG. 3 and FIG. 5. The broken outlines represent modules associated with the Detailed Design. The enumerated labels embody the sequence of operation. The steps labeled as 2 take place concurrently (same for the steps labeled as 3).

The assessment engine, shown in FIG. 13, captures a primary innovation of the ecosystem paradigm. The assessment engine offers automation of the compliance verification, and greatly increases the ecosystem's utility. This capability demarks major progress in achieving the overall goals of increased productivity and minimum rework.

To accomplish this task, it is necessary to implement reliable search algorithms capable of handling the output formats of interest (listed in Table 8). Access to the appropriate computer-aided engineering output files enables the assessment engine to search for known keywords and headers that are dependent on the requirements established by the friendly reporting of design oversights identified. We want to provide friendly, constructive explanations as to why given aspects of their design were considered not quite adequate.

Structure of the Scripting Repository

With regards to the structure of the scripting repository, it is important to note the following:

1. The designers will make selection from a set of readily available scripts pertinent to the categories of analyses of interest and the corresponding design tools.

2. The designers are not expected to engage in any scripting on their own (no Python programming).

TABLE 6

Strategy for decoding the content of the output files from popular CAE tools. The other tools from Table 8 lend themselves to similar analysis.

| Design Tool | File Type | Output Format | Text or Binary? | Method of decoding the content of an entire data files |
|---|---|---|---|---|
| SolidWorks | Part Assembly | .SLDPRT, .SLDASM | Binary | (POLE 2015) provides generic mechanism for decoding the output. 'PreviewPNG' is the stream name for image thumbnails. |
| PTC Creo (Pro/Engineer) | Part Assembly | .prt.1 .asm.1 | | Decodable using Paraview or Open Cascade, once converted into the STEP (STP) or STL formats (OpenIPT 2015), (StpIgs 2015) |
| AutoCAD (Inventor, IntelliCAD) | Part Assembly | .ipt (Inventor) .iam (Inventor) | | Decodable using Paraview or Open Cascade, once converted into the STEP (STP) or IGES formats (OpenIPT 2015), (StpIgs 2015) |
| | Native draw | .dwg | | LibreDWG (LibreDWG 2015), (LibreCAD 2015) (as opposed to OpenDWG (OpenDWG 2015)) |
| CATIA | Part Assembly | .CATPART .CATPRODUCT | Binary | Decodable using Paraview or Open Cascade, once converted into the STEP (STP) or IGES formats (OpenIPT 2015), (StpIgs 2015) |
| ABAQUS | Analysis input file (.inp) | | Text | Decoded, for example, using a Python interface (AbaPy 2015) |
| | Output database (.odb) | | Binary | Decoded using the Abaqus ODB C++ API (OdpCPP 2015) |
| ANSYS | Results | .rst, | Binary | Decodable using ParaView or OpenFOAM (ParaStruct 2015), (OpenFOAM 2015) |
| Star CCM | STARCD EnSight | cel/vrt/inp .case | Text Text | Decodable using ParaView or OpenFOAM (ParaStruct 2015), (OpenFOAM 2015) |
| Open Formats (Cross-Vendor) | Interchange | .dxf | Text | Import/export logic can be extracted from FreeCAD (FreeCAD 2015) |
| | Graphics exchange Product exchange | .iges .step (or .stp) | | Decodable using FreeCAD or Open Cascade (FreeCAD 2015), (OpenCascade 2015) (same for OBJ, IFC, DAE, OFF, NASTRAN and VRML) |
| | Stereolithography | .stl | Bin or txt | Decodable using FreeCAD or ParaView (FreeCAD 2015), (ParaStruct 2015) |

Figure 18:
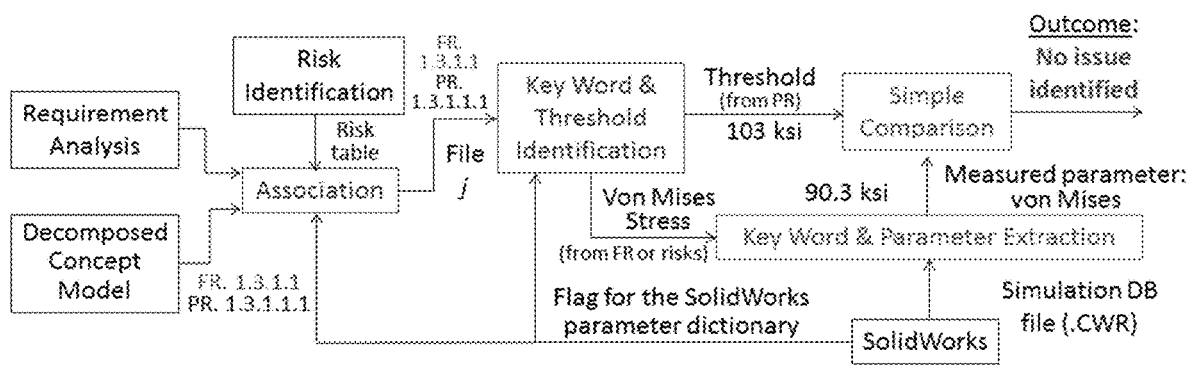
FIG. 18 captures an example of automated assessment of requirement compliance for stress of a lever arm. For insight into the Association function, refer to FIG. 16.

3. The scripts selected do not reflect the requirement directly, but the associated, generic category of analysis.
   For example, in case of FIG. 14 and FIG. 17, the designer would select the script corresponding to load reaction analysis in SolidWorks (there would be no script specifically crafted for Functional Requirement 1).
   In case of FIG. 15 and FIG. 18, the designer would select the script corresponding to stress analysis in Solid-Works.
4. Each script would instruct the design tool what type of analysis to run and on what input.

The script would also contain information on the names of the internal tokens of interest in the output file.

5. For early versions of the ecosystem, the user may be expected to provide some configuration information to the scripts, for example related to where on a given part, and along which axis, certain stress is applied.

This information will not exceed what the designer is presently providing directly to the design tools. The overall configuration necessary is expected to decrease greatly with

TABLE 7

Outline for the script selection mechanism provided by the e-Design Assessment Engine.

| | CAD | | | | FEA | | CFD |
|---|---|---|---|---|---|---|---|
| Feature | Solidworks | PTC Creo | AutoCAD | CATIA | ABAQUS | ANSYS | StarCCM |
| Scripting supported? | Yes | Yes | Yes | Yes | Yes | Jscript | Yes |
| Python supported | (PySolidWorks 2016), (PyWinExtend 2015) | PyWinCAD 2015), (FreeCADScript 2015) | PyAcad 2015), (PyAutoCad 2015) | PyWinCAD 2015), (FreeCADScript 2015) | AbaqScript 2012), AbaqScript 2010) | (Workbench 2015) | (StarCCM 2015) |
| Other interfaces provided: Properties of APIs | C++ Macros & Add-Ins (SolidWorksAPI 2015), (SupportAPI 2015) | VB API & C++ toolkit (Ptcupport 2015) | ObjectARX ® (ObjectARX 2015) | C#, C++ & VB plugins (CATIA 2015) | ODB C++ API (OdpCPP 2015) | See (ParaStruct 2015 (Paraview) | Java API (CD-Adapco 2015) |
| Structure of output files | Structured storage (POLE 2015) | Proprietary | See Table 6 | Propriety | For access, see (OdpCPP 2015) | See (ANSYS 2015) | Text (see Table 6) |
| Comprehensive code book for tokens in output files | See (SolidMacros 2016) | See (CreoTutorial 2016) | See (AutoUser 2016) | See (DassultDevGuide 2016) | See (AbaqusGuide 2016) | See (AnsysPdf 2016) | See (CD-Adapco 2016) | time, as the ecosystem matures to increased levels of automation, esp. since the ecosystem will now pass the configuration to the design tools.

Importing the Requirements

Per (Steingrimsson 2014) and (Manual 2015), the requirements can be entered directly or imported through the placeholders provided for imported documents. The global, level-0 requirements come from the PDS (Engineering Requirements tab). The decomposed, sub-requirements are synthesized through the Concept Model, as outlined in our optimization framework (see the section titled "Optimization Framework for Concept Designs").

It is assumed that for small projects, such as capstone, the requirements are entered directly, but for larger projects imported directly, as delimited text, multi-line data, or in the XML, YAML, HTML, KML, JSON, GeoJSON, CSV, Excel, JSON, SQL, DB, DBs or FlatFile formats, from an external requirement specification or MRD. The requirements can be specified stand-alone or relative to a baseline (see the section titled "Local vs. Global Requirements").

Objective Ranking of the Customer Requirements

While noting that substantial efforts must be directed at advanced feature integration to obtain maximum utility from the e-Design Assessment Engine, it is also necessary to refine the requirements established in the PDS. Although some degree of subjectivity remains at the discretion of the designer, the engineering requirements should embody the design space provided by the customer. To minimize subjectivity of the Requirement Analysis step in FIG. 13 and optimize the design space available, methods to objectify requirements have been proposed for integration into the ecosystem (Roy 2013). These methods have seen some success in reducing Condorcet preference aggregations in the selection of choices and could be implemented to reduce preferential subjectivity on account of designers as well as unintentional customer subversion. Note through that any effort to apply advanced automated validation capabilities only achieves meaningful success, if those requirements are correctly chosen and dutifully followed.

Additional requirement analysis should be accomplished within the context of the e-Design Assessment Engine itself specifically to determine the appropriateness of each requirement's categorization. It is natural for newly-indoctrinated designers to incorrectly presume the stature of a given requirement. In that the requirement category bears implications for its inclusion in the fitness function, it is imperative that requirements be correctly labelled for future decision-making. In (Imagars 2015), this categorical determination was left to mentor discretion, leveraging their judgment and wisdom as the authority for correctness. By generalizing the semantic structure of each category, it is feasible to leverage the structured nature of requirement inputs to determine with high confidence the natural choice for each requirement assignment. Automating this assessment means substantial relief for mentors over a previously meticulous manual task, equating to more time spent on mentoring and less time spent on second guessing.

Functional Analysis Applied to Detailed Design: Accounting for Parameter Dependence The Requirement Compliance Verification is intended to operate from the context of the Detailed Design phase after the Risk Analysis has been completed. For maximum benefit, the Risk Analysis capability must include the full scope of risks applicable to the concept at hand, not merely the highest-level risks specified in the engineering requirements. Risks relevant to particular concept arrangements can only be identified from the functional model that defines the concept design. Naturally, the functional model cannot merely exist in the Concept Design phase. It needs to be extended functionally to not only facilitate e-Design Assessment, but also a full-complement of additional capabilities necessary for advanced feature implementation (discussed below). For the purpose of Requirement Verification, the functional model should transfigure to a design tree representing the hierarchical arrangement of design features and their associated functional requirements (corresponding to known design risks to be analyzed; see FIG. 16). While the functional decomposition in detailed design clearly outlined optional solution paths, fitness rankings, and selection rationale, the design tree representation must be streamlined to show only final design feature selections, associated design parameters, shown in FIG. 19, and an expandable catalogue of advanced feature data that gradually refines the design point and its necessary representations.

The need for design revisions highlights an important development aspect of the design tree. As requirements are deemed to be non-compliant, it is necessary for the design team to make appropriate modifications to the concept. As opposed to progressing backward to the Concept Design for every change, it is natural to expect that most minor variations in design parameters can be accommodated within the context of the Detailed Design. In fact, certain cases of parameter optimization are the focus of numerical optimization capabilities of advanced features that are only accessible from the Detailed Design phase. So for performance optimization, it is prudent to implement the design parameter specification in the design tree such that it allows for necessary manipulation of the design point. To extract the maximum utility from this feature, we utilize graphical selection methods, such as digital slider bars, and provide an intuitive graphical snapshot of the design point iterations, for review and archival purposes.

Still, it is not the intent of this extension of the design tree to relieve the design team from the damped cycle of iterative changes typical of design process journeys. Inevitably, early concept revisions will be more substantial than later changes, and fewer recursive excursions are required for meaningful progress. When functional requirements, design features or fitness assessment require modification, those major revisions may need to be accomplished within the Concept Design phase (or even earlier).

Cloud Architecture

Figure 20:
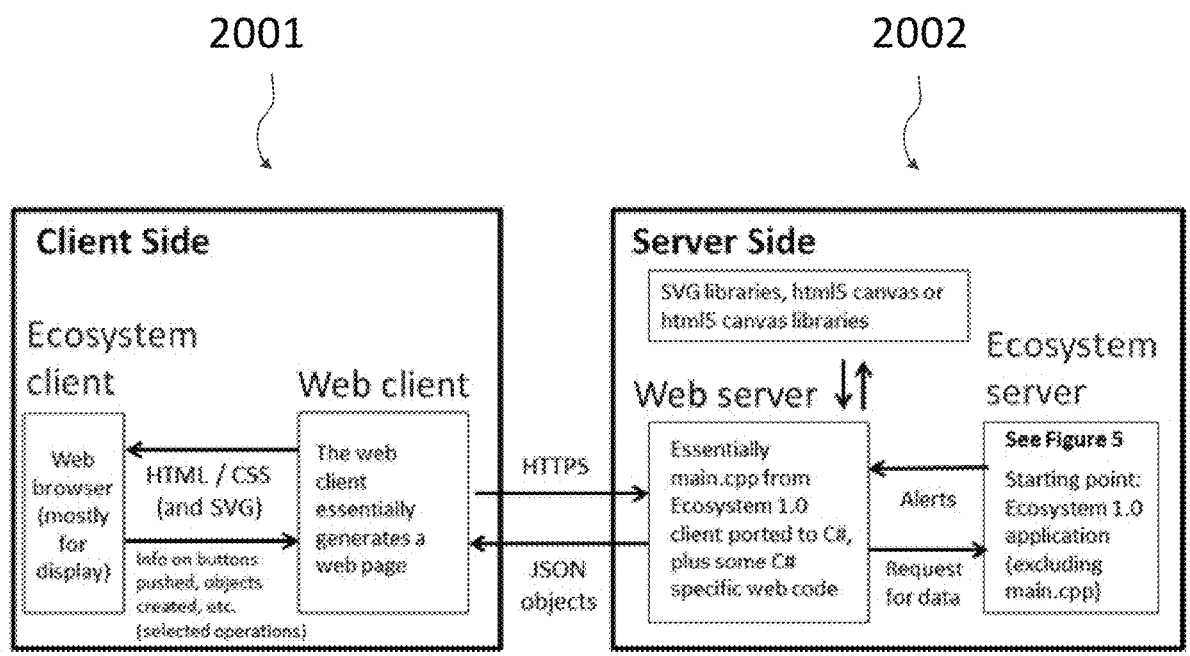
FIG. 20 outlines the high-level architecture for the communications between an ecosystem client and server.
Figure 22:
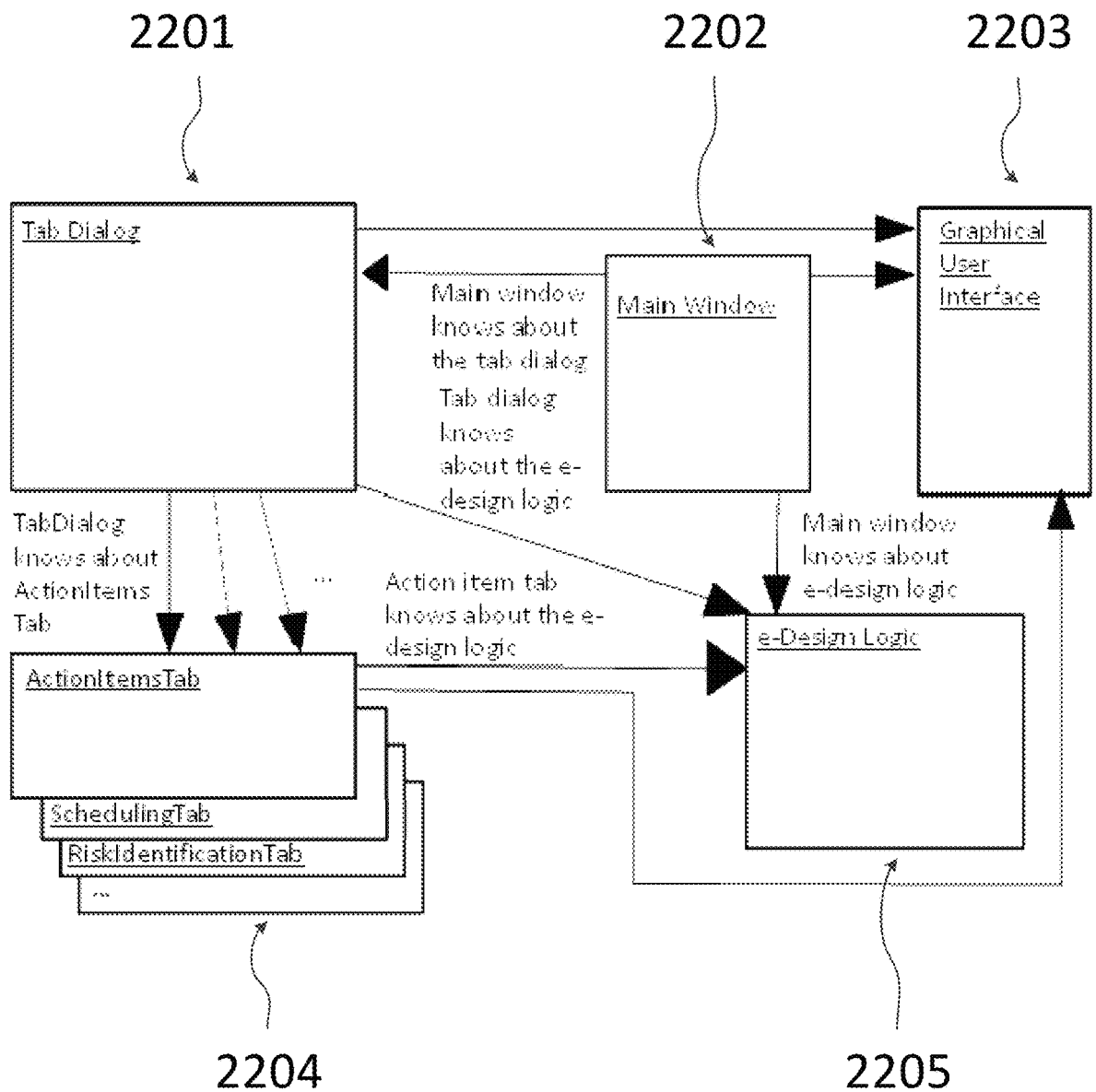
FIG. 22 shows the dependency diagram for the ecosystem GUI.

Our flexible solution, presented in FIG. 20, accommodates the customers' level of comfortability (sensitivity) in terms of data sharing:

1. To those customers, that are very protective of their data (may be developing a brand new technology), and do not feel comfortable with storing their data on our servers, we offer to integrate an ecosystem server into the network infrastructure already present at the customer premise.
2. But to customers, that are not as sensitive about data protection, we can offer a solution that assumes the customers upload their design data to an ecosystem server running on our network.

In case of the latter, the upside for the customer involves no hassle related to maintenance or support of the ecosystem server. While data protection may be a natural requirement to many customers, and the former solution seems to be generally preferred, this is not universal. To some academic customers, the convenience of the second solution outweighs the need for IP protection. Both solutions allow for big data analytics.

In addition to providing our customers with IP protection, this route also has considerable upside:
1. Access to "free" horsepower at customers' servers.
2. Access to development tools present on the customers' network (SolidWorks, ABAQUS, ANSYS, etc.).
3. Ability to share responsibilities related to maintenance & support with the customers' IT staff. The first two items carry significant implications with regards to pricing of the ecosystem framework.

FIG. 20 is a traditional client/server architecture utilizing the AngularJS and WebAPI frameworks. The server application can be written in C++, probably in Visual Studio (or the Qt Creator). The preferred solution for the web server is a C# application written in WebAPI (.NET). As a fall back, one can consider a C# application written in WCF (also .NET). The preferred solution for the web client is a C# application written in AngularJS. The fall back is a C# application written in ASP MVC (also .NET).

FIG. 20 is an extension of the scalable architecture presented in (Steingrimsson 2014).

Graphical User Interface

FIG. 21 captures our web-based GUI. In addition to the cost savings (students would not need to purchase any hardware for their design classes), the web application offers the advantage of being agnostic to the operating system involved. Also, students do not need to purchase a new device, in case their current one got lost or damaged. All they need is access to a computing platform, a web browser and an internet connection.

To implement interfaces, similar to the one in FIG. 21, many GUI frameworks rely on the model-view-controller paradigm (Model-View 2015). View is the GUI, model is the engine producing the data, and the controller is the code linking the two. The key is to impose clear separation between the data and the processing of the data (see FIG. 22). The GUI can be built using C++ web toolkit called Wt (Wt 2015) on basis of the modular architecture in FIG. 22.

Figure 23:
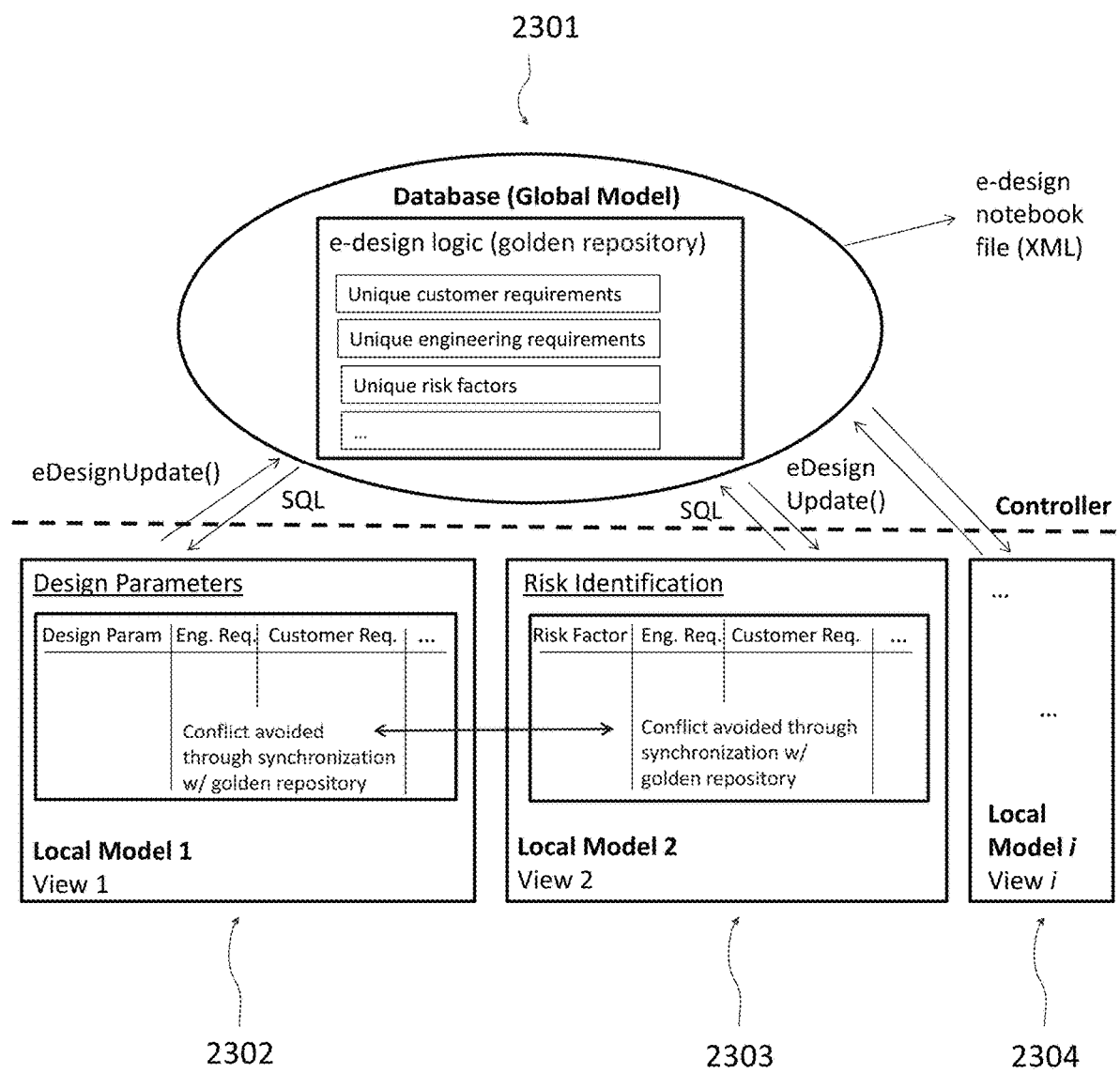
FIG. 23 presents architecture capable of avoiding conflicts among design contents within the ecosystem, through automatic synchronization with a global database (golden repository), referred to as e-design logic. It is essential that each design entity only has one representation in the e-design logic.

We have configured the GUI architecture, as shown in FIG. 23, such as to avoid conflicts among design contents within the ecosystem. Specifically, we have instilled automatic synchronization of the design entities in each tab with the global e-design database (our golden repository) shown in FIG. 22. By ensuring that each design entity only has one representation in the e-design logic, we are able to track everything to a common source. Through auto-population and by making auto-populated cells uneditable, we have been able to avoid conflicts, but also devise a GUI that is efficient, convenient, and one that is hard to use incorrectly, even by novice designers.

Figure 19:
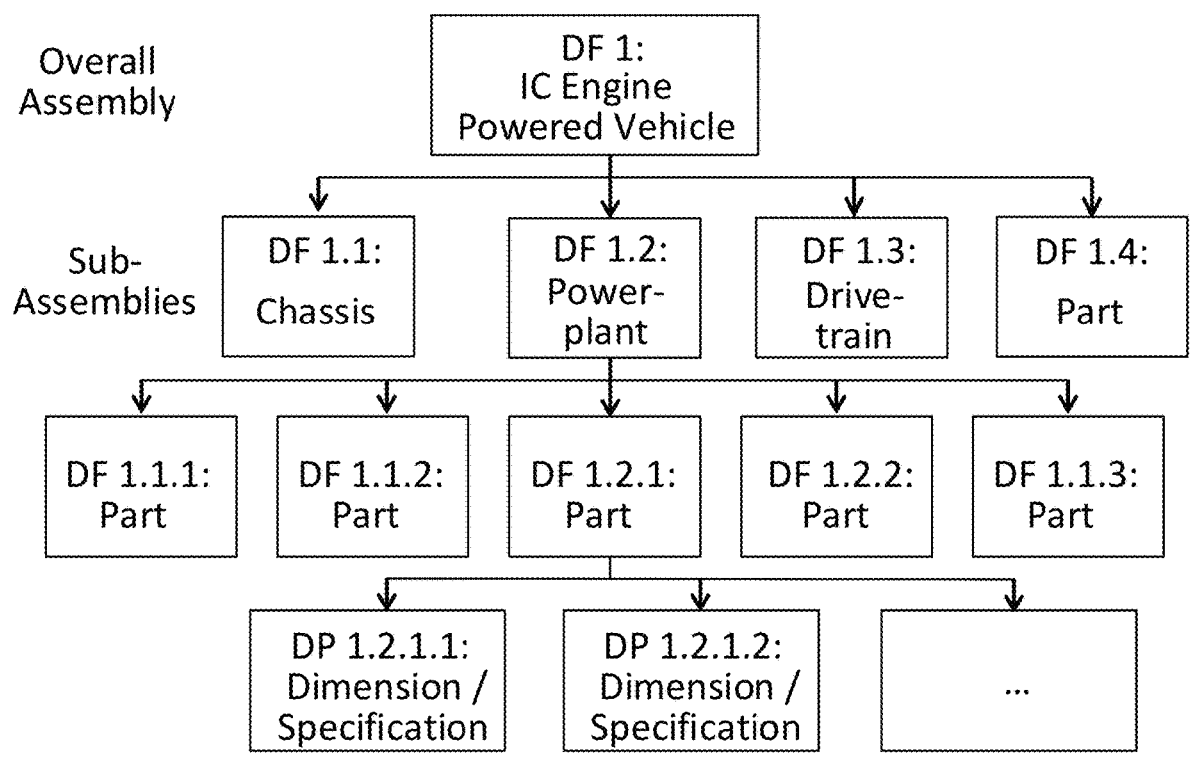
FIG. 19 presents a generic design tree capturing the hierarchical dependence between the design features (DFs) and design parameters (DPs). The design tree allows us to account for the dependence between the parts in the assemblies imported into the ecosystem.

Further, our GUI architecture is generic, flexible, and consistent with the design tree in FIG. 19. Through a three-tier tab structure, shown in FIG. 24, one can accommodate small as well as large design projects. In case of a single, small project, the top tier does not need to be used at all. But it may be used to track multiple, small projects. For larger design projects, the top tier can be used to track progress on individual subsystems.

Customization Accessible Through the Supervisor Mode

The supervisor mode is implemented as a "hidden" mode in the ecosystem resulting from (Steingrimsson 2014), i.e., accessible only through a special key combination. But when enabled, the supervisor can, for example, specify the severity threshold for alerts (the threshold above which alerts get reported).

This invention extends this functionality. We provide supervisors with the ability to
1. Configure the value structure within the ecosystem.
   We equip the supervisor with the ability to specify the severity levels associated with the individual alert messages.
   Supervisors also can tweak the performance indicators and learning outcomes.
   The instructors have the ability to configure the ecosystem such that its metrics accurately reflect their desired value system.
2. Tweak selected design environment parameters.
   This is needed for meaningful evaluation of designs.
3. Configure the systems appearance (within certain limits).
   This includes the composition of selected drop-down lists.
   Supervisors, for example, have the ability to specify tooling levels used for manufacturing.
4. Associate e-mail alerts with important assignments.
   The e-mail alerts could pertain to supervisor approval needed prior to pursuit of high-risk items.
   Or they might involve notifications regarding incomplete assignments whose due date just passed.
5. Track what was altered in the e-design notebooks (project journals), by whom and when.

Fortunately, many of the popular GUI frameworks, such as Qt or Wt, provide relatively simple solutions for addressing items 1-3. Customization of the user interface can, in many cases, be accomplished, in a relatively simple fashion, through deployment of configuration (text) files. These can, for example, store content of the drop-down lists.

Interface with Industry Databases for Codes and Standards

The purpose of the database is to verify relevance (sanity) of the user input in the context of the design project at hand. We want to bring designers quickly back on track, in case they inadvertently lose context. The rubric utilized by the original ecosystem SW has no provisions for verifying the rudimentary sanity of the input. The user could inadvertently reference a non-existent standard, such as IEEE Standard 123, or for that matter enter complete garbage, without the e-design logic raising a concern.

In addition to the interface with industry databases for codes & standards, the ecosystem provides access to other types of databases, such as for legacy design archives, through the cloud network. Access to the latter databases does not call for special solutions.

Figure 25:
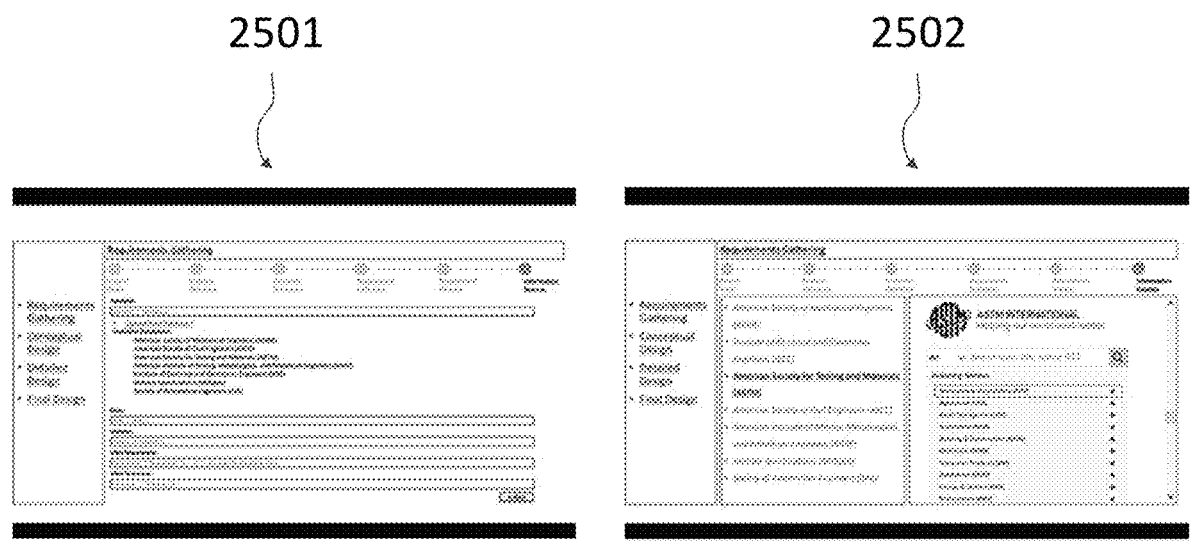
FIG. 25 shows a solution for accessing industry databases for codes and standards from the ecosystem.

As an initial step towards verifying the sanity of the input provided, in the context of the design project at hand, we present the interface in FIG. 25. Here we are showing hyper-link access to the database hosted by American Society for Testing and Materials (ASTM). The ASTM standards library is a subscription-service but standard searches are free for identification of applicable codes and standards based on keywords, categories, topics, sub-topics and a variety of other methods. Tailored access to the database is provided by their proprietary Compass™ service and a la cart access to services is available.

The following is essential to our technical solution:
1. The context verification is restricted to individual key phrases in the user input (mostly nouns).
   At least in the beginning, it is not our intent verify the semantic relevance of complete sentences (still a largely unsolved problem?), or even of a sequence of words, in the context of the design project.

To begin with, we will limit the context verification to specific input parcels, such as the strings provided in the tabs for Project Title, Information Sources or Action Items.

The sections of the e-design notebooks with the least constrained input, such as the Narration tabs, will be addressed later (but using analogous solution principles).

For the parcels of interest, we will break the strings down into individual words and isolate the nouns.

2. Our solution relies on storing relevant key words in a database, and then verifying sanity by confirming presence in the database of key phrases from the input.

3. We will rely on access to online, industry databases for codes and standards, through institutional licenses.

It makes sense to take advantage of such subscriptions, when available.

4. When an institutional license is not in place, some universities may consider this as a premium feature, and may choose to exclude it.

Direct access to industry databases will be considered a premium feature, and will be excluded from the baseline formulation of the ecosystem (and certainly from the student version), for cost reasons.

In this case, the instructor (or mentor) can manually assess whether the input is valid or not.

5. Regardless of whether an institutional license is in place or not, the students' responsibilities (hassle) in terms of configuration are expected to be minimal-to-none.

6. Design organizations are likely to expect support for industry databases (and be willing pay for it).

Interfaces with Tools for Engineering Design

For the output file formats from many of the popular CAD, FAE and CFD design tools, Table 6 outlines our strategy for decoding the content of the output files (i.e., for implementing the decoding mechanism shown in FIG. 13). Our analysis of the design tools is restricted to their outputs, because this is what the e-design process assesses. Our analysis is, further, restricted to the high-priority CAE tools in Table 8. The other tools lend themselves to similar analysis (the analysis is relatively easy for the ones with text-based output files). For many of the FAE and CFD tools, the content of the output files can be decoded using ParaView (ParaView 2015). In case of the CAD formats, which tend to be binary and proprietary, we are planning a phased introduction. Here we assume the user would, in the interim, save the design work in one of the open formats, such as STEP (STP), IGES or .STL, prior to importing into the ecosystem.

Expanding further on FIG. 13, Table 7 summarizes our approach for addressing the scripting selection mechanism provided by the e-Design Assessment Engine. From Table 7, we draw the following conclusions:

1. Scripting seems to be a feasible solution for configuring the development tools to needs of the Ecosystem.

2. Aside from ANSYS (which offers Java-based scripting), most of the development tools of interest support Python scripts. As a result, we are building the scripting repository in FIG. 13 around Python scripts.

TABLE 8

List of candidate software for advanced feature implementation.

| Field of Analysis | Software (Company) | Output Format | Open-Source SW | Est. Size of User Base |
|---|---|---|---|---|
| Solid Modeling | AutoCAD (Autodesk) Catia (Dassault Systdemes) Inventor (Autodesk) Solidworks (Dassault Systemes) | DXF, DWG, DRW, IGES, STEP, STL, Other | FreeCAD, Qcad, LibreCad, pythoncad.org, | Very Large $O(10^5+)$ |
| Finite Element Analysis (FEA) | Abaqus (Dassault Systemes) Ansys (Ansys) Simulation Multiphysics (Autodesk, ALGOR) Star CCM (CD-Adapco) | NB, ODB DAT, FIL, OUT, Other | Advanced Simulation Library (ASL), PyFEM, GMesh, AbaPy | Very large $O(10^4)$ |
| Computational Fluid Dynamics (CFD) Computational Electromagnetics (CEM) | Ansys (Ansys) COMSOL Multiphysiscs (COMSOL) FloTherm (Mentor Graphics) Star CCM (Cd-Adapco) | CGNS, Plot3D, XDMF, Tecplot, Other | OpenFOAM (OpenFOAM 2015) | Very large $O(10^4)$ |
| Multi-Body Dynamics (MBD) | Abaqus (Dassault Systemes) Adams (MSC Software) COMSOL (COMSOL) Matlab (MathWorks) SIMPACK (Simpack) | TXT, XML, CMD, Other | Advanced Simulation Library, MBDyn | Large-Very large $O(10^3\text{-}10^4)$ |
| Process Simulation | Aspen Plus (Aspen Technology) Dymola (Dassault Systdmes) ProModel (ProModel) Wolfram SystemModeler (Wolfram Research) | VSO, MAT, TXT, XLS, PDF, Other | DWSIM | Large $O(10^3)$ |
| Multidisciplinary Design Optimization (MDO) | APMonitor (APMonitor) Matlab (MathWorks) Mathematica (Wolfram Research) | MPS, XLS, MAT, TXT, MTX, NB, HDF, Other | OpenMDAO | Large $O(10^3)$ |
| Electronic Design Automation (EDA) | Advanced Design System (Keysoft) Altium Designer (Altium) Eagle (Cadsoft) | DXF, SPICE, ODB++, Gerber/drill, PDF, STEP, Other | gplEDA, gEDA, KiCad EDA | Medium-Large $O(10^2\text{-}10^3)$ |

3. As a fall back, the design tools offer an alternative, albeit more time consuming, way for configuring their operation. Here, one feeds in the input, text files through an API, often utilizing plugins, add-ons or macros.
4. Availability of comprehensive code books with lists of the internal tokens greatly helps with programming.

For the case when the Ecosystem server is integrated into the network infrastructure at a customer's premise, access to the development tools is relatively straight forward (since both the server and the design tools will be residing on the same network). But even when the ecosystem server is hosted on proprietary servers, it is important to note that the vendor does not need to provide direct access (licenses) to the development tools. There are significant cost savings associated with offloading this to the client side. Here the ecosystem server (residing on the vendor's servers) would send the configuration scripts to the ecosystem client (residing on the customer network), which would pass the scripts to the design tool of interest (also residing on the customer network). The output file would be sent back to the ecosystem server through the client. If the size was excessive for transmission, say, over a wireless network, the ecosystem client could apply initial analysis to the output and only pass distilled primitives to the ecosystem server for final decision processing.

Integration with the Engineering Design Tools

FIG. 13 outlines our high-level approach for integrating the ecosystem with established tools for engineering design.

In order to maximize the utility of the design ecosystem it is necessary to consider the core competencies of the framework. Predominantly, the software breaks up design tasks into a consistent, accountable workflow. The guided, structured PDS and rigid functional decomposition serve to better organize and capture pertinent data for use in available analysis packages suitable for later-phase activities. These analysis packages largely constitute advanced features. Activities in early phases that manage and encourage logical progress and creative developments should provide a solid basis for feeding design information to subsequent software for advanced analysis. An incomplete list of commercial CAE packages targeted for potential integrated access in the ecosystem is summarized in Table 8. The list has been prioritized to emphasize integration to the analysis software suites commonly accessed by mechanical and aerospace designers. It should be noted that the entries in Table 8 constitute only the commercially available offerings with considerable use in industrial settings.

Note that while Table 8 lists tools mostly used by mechanical and aerospace designers, it can be extended. The approach of FIG. 13 can be applied to engineering design in general. The requirements may involve mechanics or even software or firmware. Fundamentally, the extent of the assessment is limited by what the lower-level simulation tools can provide about the design at hand.

Figure 26:
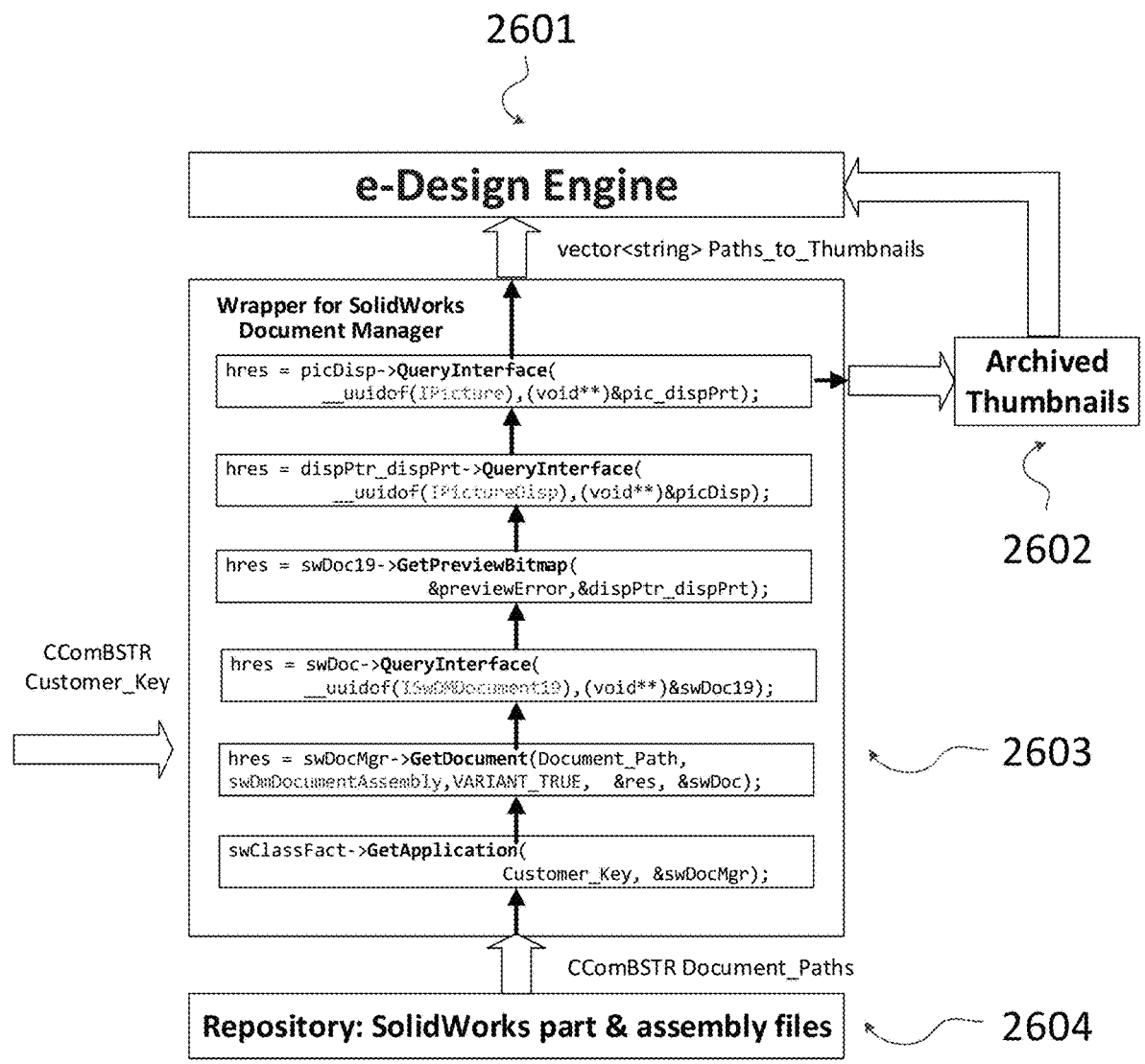
FIG. 26 offers specifics as to how the e-Design Assessment Engine interfaces extracts design parameters from SolidWorks parts or assembly files, through a wrapper created around the SolidWorks Document Manager. The extraction of thumbnail images was selected for illustration.

As an example, in case of Solidworks, the integration is achieved by incorporating into the e-Design Assessment Engine a software wrapper, such as the one shown in FIG. 26. The wrapper invokes the SolidWorks API, from the e-Design Assessment Engine, through use of the SolidWorks Document Manager API (SolidWorksDocMgr 2017). The Document Manager API is configured to authenticate calls to the rest of the SolidWorks API with license information specific to the vendor of the e-Design Assessment Engine:
CComPtr<ISwDMClassFactory> swClassFact;
CComPtr<ISwDMApplication> swDocMgr;
HRESULT hres=swClassFact.CoCreateInstance(_uuidof (SwDMClassFactory), NULL, CLSCTX_ INPROC_SERVER);
CComBSTR HK_Key=_T("SOLIDWORKSRDLtd:swdoc-mgr_general-[license-details-omitted]");
CComBSTR Customer_Key=_T("ImagarsLLC:swdocm gr_general-[license-details-omitted]");
CComBSTR Customer_Key2=_T("ImagarsLLC:swdoc-mgr_general-[license-details-omitted]");
swClassFact→GetApplication(Customer_Key, &swDoc-Mgr);

The license key has been made available for free to members of the SolidWorks Partnership Program. Although FIG. 26 is specific the case of real-time extraction of SolidWorks post-2014 parts and assembly files, one can note that similar wrapper-based approaches can also be applied to achieve integration with other CAD or CAE vendors, many of which offer their own APIs and Partnership Programs.

Figure 27:
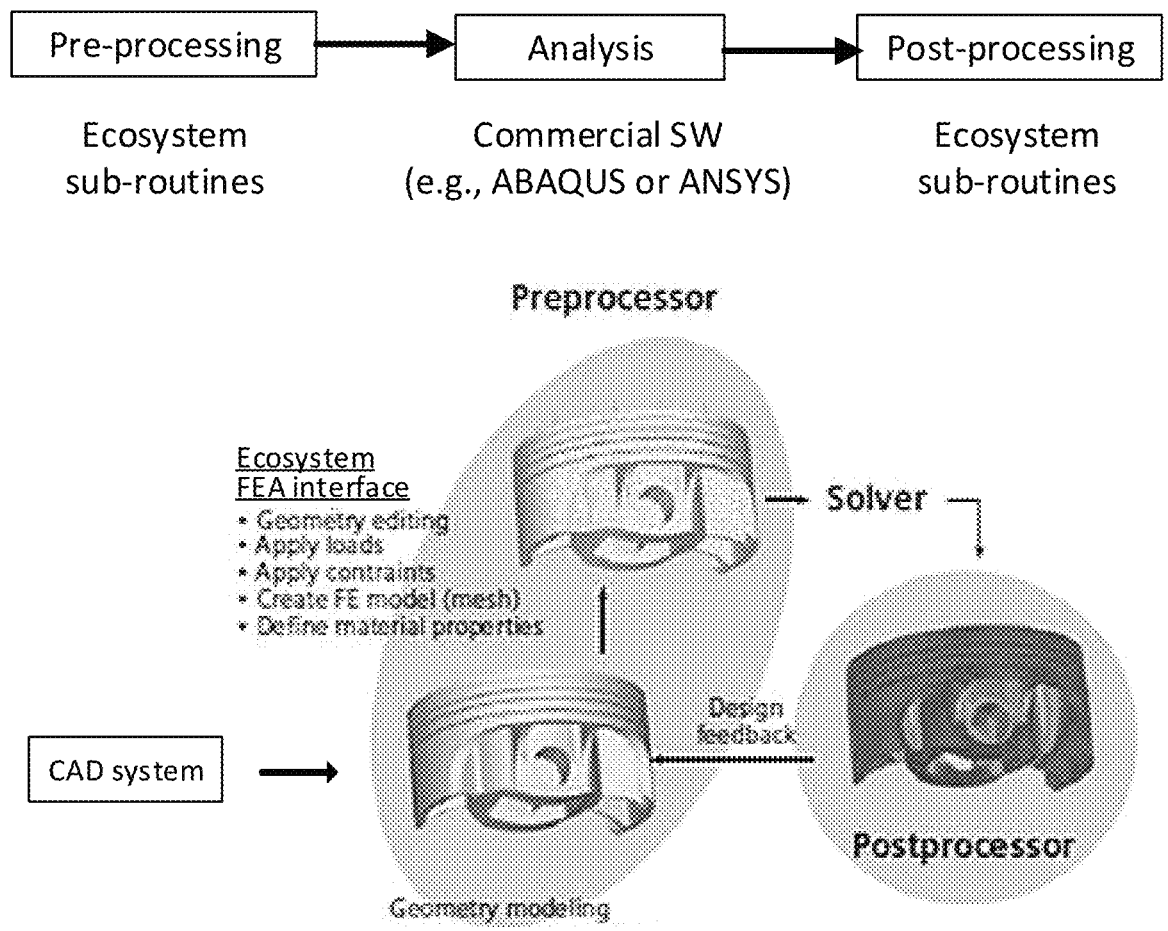
FIG. 27 illustrates how ecosystem sub-routines can work with commercial software, such as for finite element analysis, to offer improved performance.

More on Plug-and-Play: Customization with Commercial Design Tools for Expediency and Improved Performance Since many product designs require CAD, geometric modeling, and thermo-mechanical simulation of parts and structures, integration of both CAD and CAE tools into the Ecosystem offers a level of convenience. By launching commercial, lower-level simulation tools from a higher-level Ecosystem interface, as described in FIG. 27, along with Ecosystem sub-routines, when or if needed, one can achieve plug-and-play interoperability of CAE and CAD tools. This allows new use of new and legacy simulation tools, with CAD models obtained from a variety of sources, on complex geometric models with minimal or no human intervention or preprocessing. Mechanical CAD data preparation continues to dominate most CAE activities, hindering use of advanced engineering simulation tools, and resulting in excessive costs across a broad range of design and manufacturing activities. Most commercial and legacy tool require gridding or meshing—semi-automated heuristic procedures that rely on human experts and manual processing.

Integration with Established Tools for Requirement Management, PLM, PDM or CPD

Figure 28:
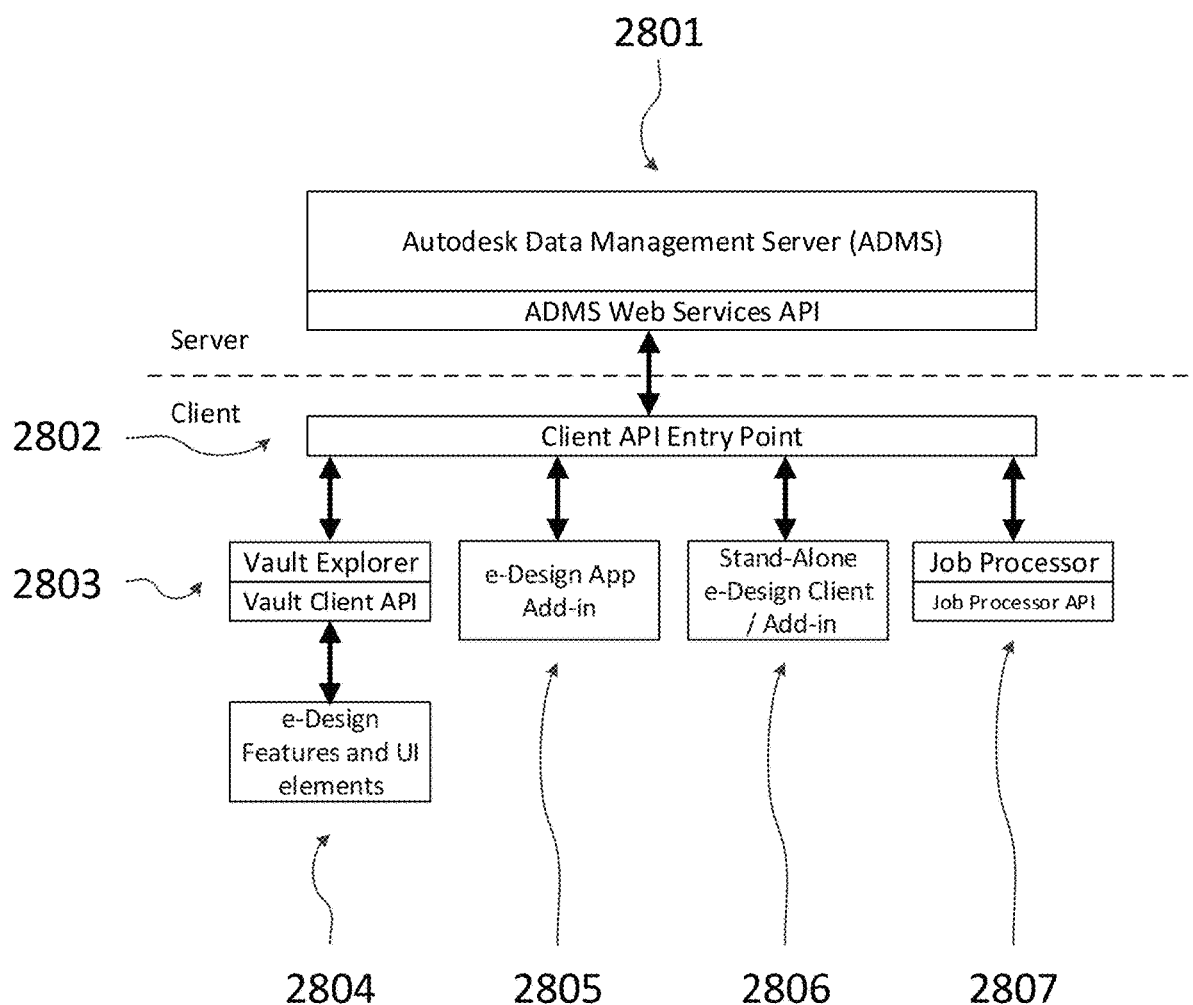
FIG. 28 shows how the e-Design Assessment Engine can be integrated into existing PDM or PLM applications. This example applies to design organizations using the Autodesk Fusion 360 perhaps with the Autodesk Vault.

The e-Design Assessment Engine can be integrated, as an add-in or plugin through a web API, into established tools for requirement management, PLM, PDM or CPD, such as IBM Rational DOORs, IBM Rational Team Concert, Autodesk Fusion 360, Autodesk Vault, SolidWorks PDM, or Siemens Team Center. Specifically, for enterprise applications, in particular the ones utilizing the Autodesk Vault (Fusion 360), the web API is implemented through usage of ADMS web services API, a client API entry point, and Vault client API, as shown in FIG. 28.

Big Data Analytics

The design content assembled consists of the e-design notebooks from all team members, or even all design projects within a given organization, plus the linked in design files, the outputs from the design tools, material from the industry databases (results from context verification), the configuration scripts, examples, content of sample databases provided along with the ecosystem SW, legacy databases for known good designs, search analytics, information on manufacturing procedures, material characteristics, material prices, parts that can be obtained from elsewhere, etc. The outcome is a huge database. This invention presents a scheme for holistic big data analysis of all the design content assembled. With proper database representation of the design content, and references from the design project journals (e-design notebooks), one can categorize the data and run various cross-correlations (searches) across projects or within projects. By storing the comprehensive design history in the cloud, and harvesting repositories of known good designs through database queries, one can improve design decision fidelity for new designs. Access to such repositories can also prove invaluable for the purpose of post-mortem failure analysis.

Figure 29:
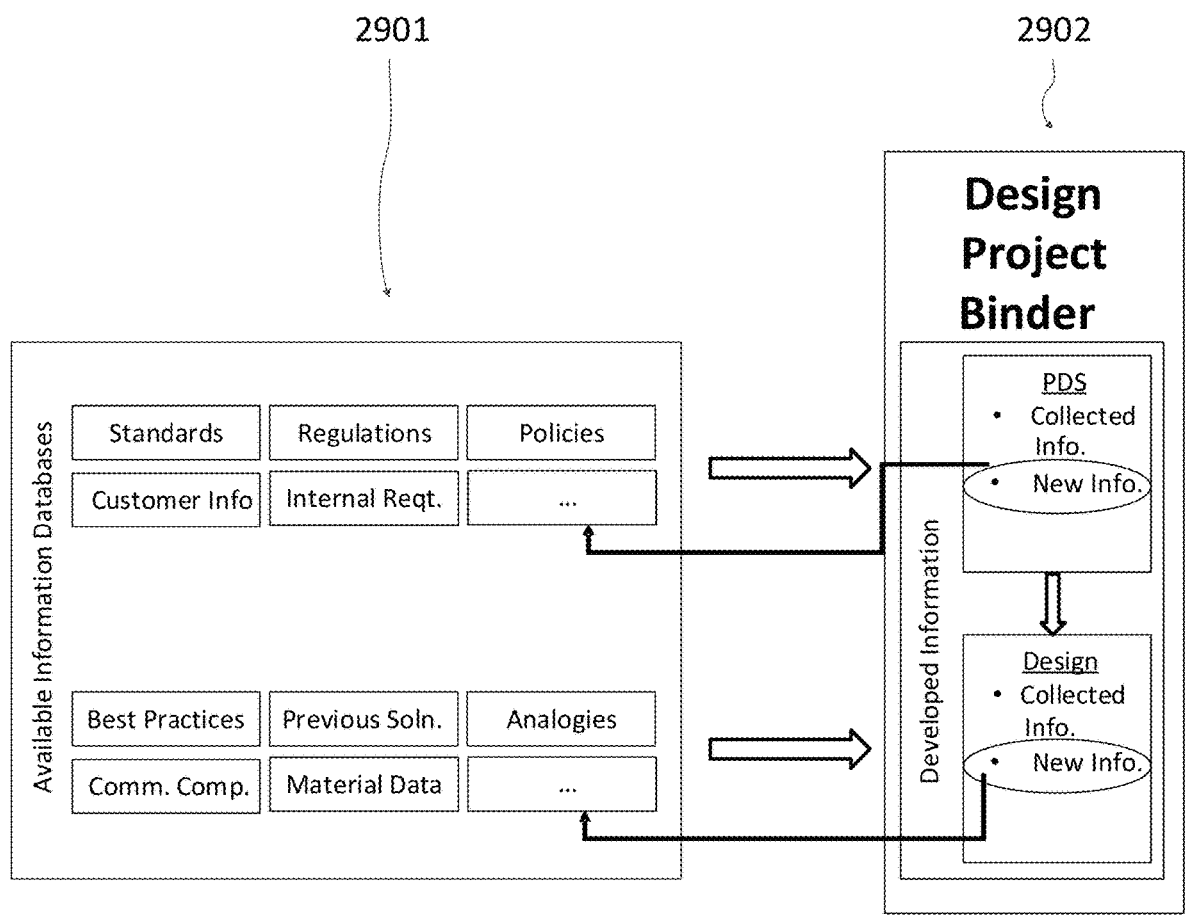
FIG. 29 illustrates how e-design notebooks can access existing data in organized databases and create pointers to pertinent content. Content created in the workbook is structured to facilitate storage for future utility. Workbook input format allows preservation of context with content. Useful third-party data available in structured databases with context provided.

FIG. 29 summarizes one viable embodiment of the invention. Here, the e-design workbooks (project binders) access data in organized databases holding all the design information and create pointers to the pertinent content. The workbook input format facilitates storage for future utility by associating (preserving) context with content. Useful third-party data is accessed from the databases with available information, with context provided. The databases can be owned by the ecosystem vendor, the customer or a third party. The designers select what information is pertinent for their design project. This arrangement opens up an entire world of information that otherwise would have taken significant work to leverage.

The information developed for the e-design project binder in FIG. 29 consists of pointers to PDS and Design objects. The PDS comprises of requirement objects, in programming context, and the Designs are comprised of component and assembly objects. Both can have hierarchy imposed. The design data itself is stored in mass outside the application.

Figure 30:
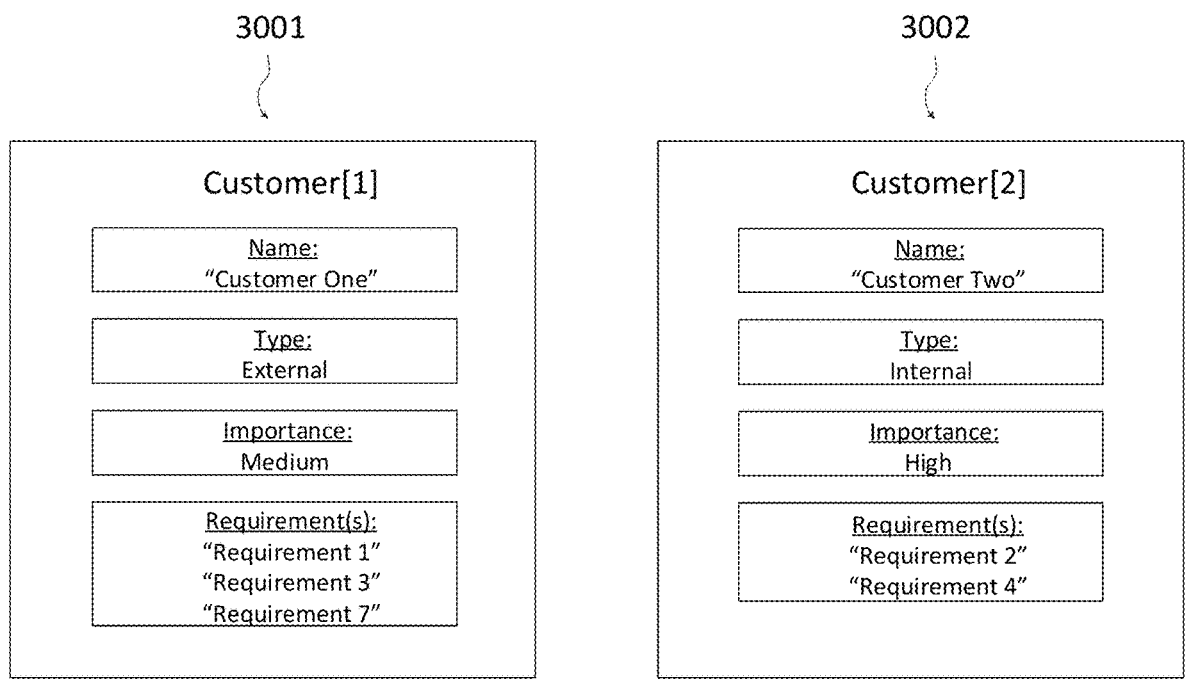
FIG. 30 shows how the PDS object can be built using pointers to a database, for the purpose of being big data compatible. In programming context, the PDS is comprised of requirement objects, and the designs component and assembly objects. Both can have hierarchy imposed.
Figure 31:
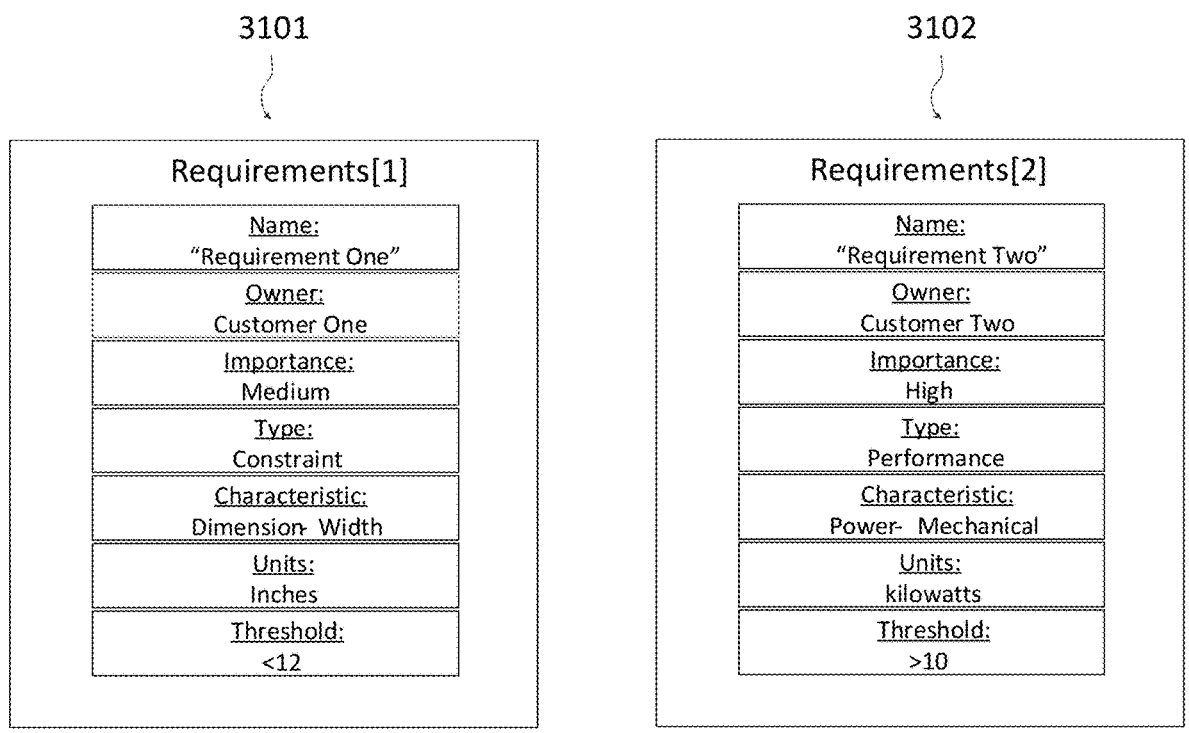
FIG. 31 presents an example of a requirement database (objects).

FIG. 30 and FIG. 31 present embodiments of customer and requirement object from the PDS database. Through the PDS object, the designer builds up a collection of pointers to pertinent design information objects. It is of key importance to define the proper attributes for the object pointers in the PDS database, and accordingly formulate meta data and leading indices. The design databases themselves are not project specific, but much broader. In case of the PDS database, the object pointers considered pertinent are listed in Table 9 and Table 10. The Constraints in Table 10 may be binary and relatively easy to verify. The Performance Requirements may involve binary thresholds, and are judged in accordance to the performance. The Objectives involve no thresholds, but rather a min/max consideration for decisions.

TABLE 9

Attributes pertinent to the Customer objects in the PDS database.

| Attribute | Description |
| --- | --- |
| Name | Organization, Person, Entity |
| Type | Internal, External, Other |
| Importance | Low, Medium, High |
| Requirement | Key to Requirement database: Requirement[ ] |

TABLE 10

Attributes pertinent to the Requirement objects in the PDS database.

| Attribute | Description |
| --- | --- |
| Name | Descriptive name for the Requirement object |
| Owner | Key to customer database: Customer[ ] |
| Importance | Low, Medium, High |
| Type | Constraint, Performance or Objective |
| Characteristic | Key to characteristics database: Characteristic[ ] |
| Units | Key to units database: Units[ ] |
| Threshold | Value for binary assessment |

With the e-design workbooks consisting of a collection of pointers, the central purpose of the e-Design Assessment Engine is to create, extract and potentially delete pointers as appropriate. This invention presents a method to generate or find content pertinent to the design problem at hand in the databases available. It is assumed that, during the course of a design project, the database continues to grow. If design content is not available already (say, through a third party), designers can define it in-house.

Figure 32:
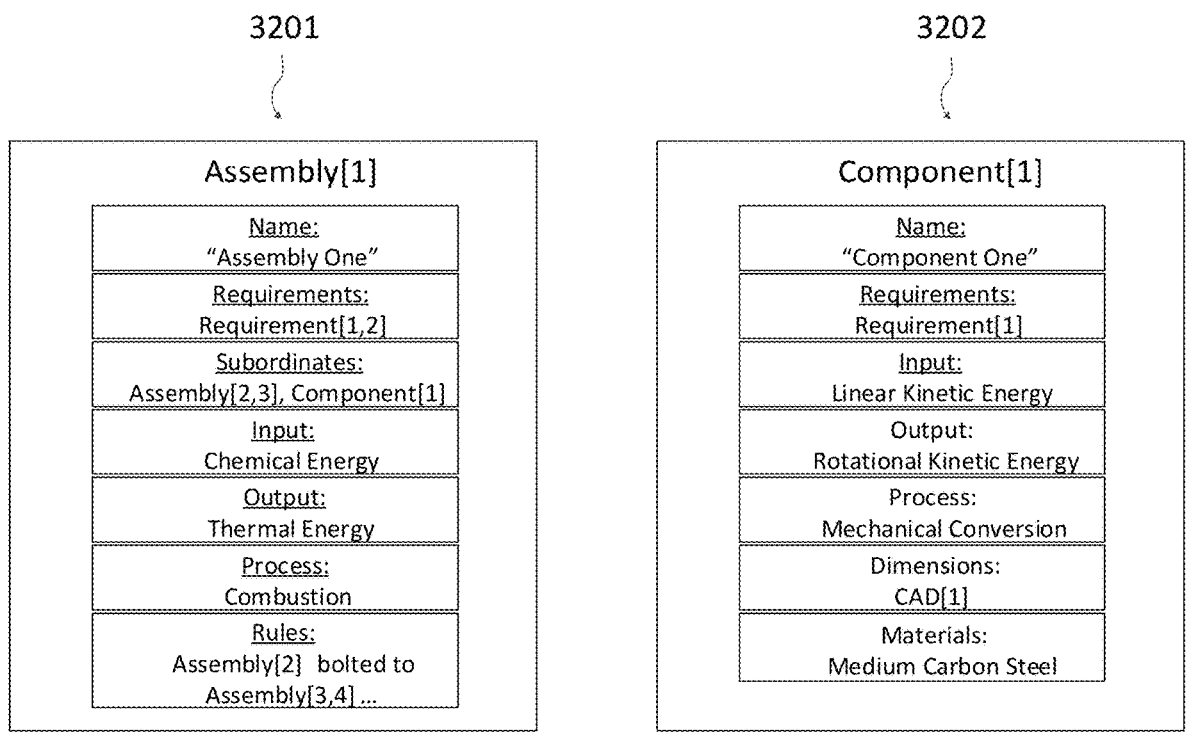
FIG. 32 provides illustration of a design database with assembly and component objects.

FIG. 32 present an embodiment of the Assembly and Component objects from the Design database. The Assembly objects consist of nested, aggregated subordinate levels, and have authority to define requirements applicable to the subordinates. The Component objects consist of individual parts, pieces, or obtainable, self-contained assemblies. In case of the Design database, the pertinent attributes for the Assembly and Component objects are listed in Table 11 and Table 12. The Rules in Table 11 specify the governing constraints of aggregated subassemblies and components.

To be big data compatible, it is assumed that the Design database complies with standard

TABLE 11

Attributes pertinent to the Assembly objects in the Design database.

| Attribute | Description |
| --- | --- |
| Name | Descriptive name for the Assembly object |
| Requirements | Key to the PDS database: Requirement[ ] |
| Subordinates | Define subassemblies and components |
| Input | Key to database: Flow[ ] |
| Output | Key to database: Flow[ ] |
| Process | Key to database: Process[ ] |
| Rules | Key to Rules database: Rules[ ] |

TABLE 12

Attributes pertinent to the Components objects in the Design database.

Figure 33:
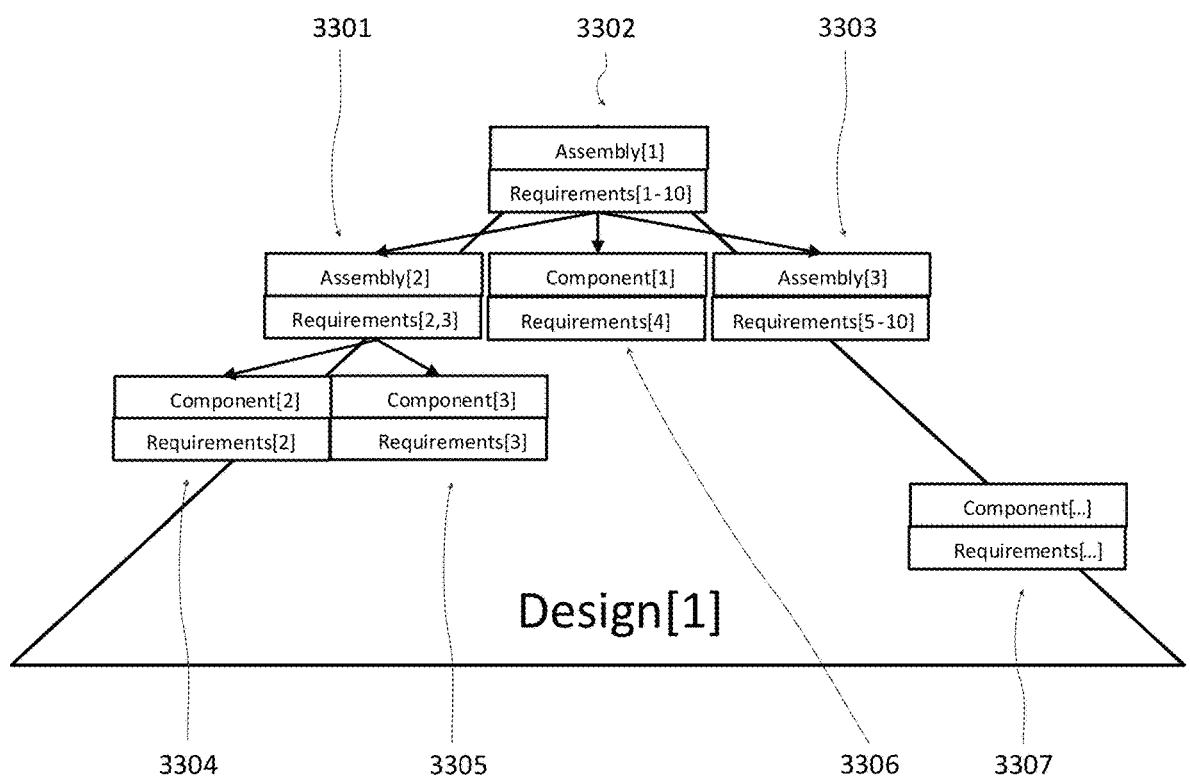
FIG. 33 illustrates how component options and risks can be programmed into databases based on existing engineering knowledge (for example, machine design text awareness of risks for certain components or uses).

| Attribute | Description |
| --- | --- |
| Name | Descriptive name for the Assembly object |
| Requirements | Key to the PDS database: Requirement[ ] |
| Input | Key to database: Flow[ ] |
| Output | Key to database: Flown |
| Process | Key to database: Process[ ] |
| Dimensions | Nominal and tolerance, in the form of solid model data |
| Material | Key to database: Material[ ] |
| Properties | Description of miscellaneous properties | relational database (schema) formats. FIG. 33 shows how the Component options and risks can be programmed into the database, based on engineering knowledge gleamed from prior designs (for example, related to machine design text awareness of risks for certain components or uses).

Big data analysis capabilities of the e-Design Assessment Engine can be applied at organizations with design repositories arranged in the form of relational databases. The core concept of project binders accessing data in organized databases holding all the design information, and creating pointers to the pertinent design content, may be adapted to other database structures.

Big data analysis capabilities of the e-Design Assessment Engine are not expected to interfere with other tools for big data analysis, such as Hadoop, that may already be in place. Both can access the same underlying data in parallel. Still, similar to the integration of the e-Design Assessment Engine into established tools for requirement management, PDM, PLM or CPD, this invention offers provisions for integrating the big data analysis capabilities listed into existing tools for big data analysis.

5. How to Use the Invention

1. For Automatic Verification of Engineering Requirements

The invention outlines a generic design decision support framework, one that applies across different fields of engineering design.

The invention can be used to verify requirements both for new designs, on basis of a global requirement list, and for improving existing designs, in part through identification of local requirements.

The projects involved can be large or small, such as
1. New student design projects with a relatively small team (e.g., capstone);
2. Ongoing student design projects with a large or small team (e.g., Formula or BAJA SAE);
3. Industry project at a small or medium-sized design organization; or
4. Projects at large design organizations (e.g., where the e-Design Assessment Engine is integrated into an enterprise system for requirement management).

2. For Helping Engineers Avoid Design Oversights (Through Improved Design Making)

The design ecosystem can help practicing design engineers stay on track throughout the design project, ensure efficient compliance with the design processes, minimize the chance of unproductive design activities, and prevent design oversights.

These same benefits can be achieved by using the e-Design Assessment Engine, not as a part of the Ecosystem, but integrated into existing platforms for requirement management (PDM, PLM or CPD).

3. For Helping Designers or Supervisors Track Progress, Save Cost and Achieve Timely Completion The supervisor layer allows managers to viewing logs related to design activities and progress (archived alerts). The digital ecosystem can help supervisors in terms of producing seamless and expeditious reports and responses related to design activities. It can also help in terms of tracking resource expenditures and projecting completion dates, as explained in the section titled "Summary of the Invention".

These same benefits can be achieved using the e-Design Assessment Engine, if not used as a part of the Ecosystem, but integrated into existing platforms for requirement management (PDM, PLM or CPD).

4. For Efficient Dissemination of Design Information to Engineers not Directly Involved in the Product Design Itself (Engineers Working on Related Support Activities)

Through the interface with the data product management tools, the collaborative product development tools, the product lifecycle management tools, engineers not directly involved in the original product design tools can implement, tweak and verify designs developed using the digital ecosystem. Design files may be archived in a database from which the latter engineers can check them out. Similarly, engineers working further downstream in the product development chain can access the cloud server for design related data.

5. For Efficient Collaboration with Other Stakeholders

Customer requirements from other stakeholders, such as marketing, can be imported into the ecosystem, and they can monitor progress.

6. For Training Entry-Level Engineers on the Internal Design Processes of Given Organizations Similarly, the digital ecosystem is also suited for engineering design companies that train their entry level engineers (mentees) by pairing them up with senior, experienced engineers (mentors). The ecosystem can be used to teach entry-level designers effective design techniques, leading to productivity enhancements that would result in increased competiveness, higher quality, and shorter time-to-market.

7. For Teaching Engineering Students Proper Design Techniques

The digital ecosystem is targeted, in part, towards educational institutions that teach courses on engineering design. Here the primary customers are students (mentees) of design courses, especially capstone design courses, and their instructors (mentors). The digital ecosystem will allow the instructors (or mentors) to assess students' performance with less subjectivity, and on a continual basis. It will contribute to the training of strong and competitive STEM workforce. The ecosystem will enable individualized learning for the digitally sophisticated millennials by allowing customized configurations of the tablet device to suit different learning styles. Higher quality teaching is expected to result from more rapid response from the instructors (mentors) and enhanced ability to get the students (mentees) back on track. The technology also provides students with means to stimulate their creativity during the design process, by enabling quick explorations of variations of key design ideas.

8. For Reducing Time Spent on for Mechanical CAD Data Preparation (for Minimizing Human Intervention), and for Improved Performance Through "Plug-and-Play"

The ecosystem can facilitate usage of new and legacy engineering simulation tools on complex geometric models with minimal human intervention or preprocessing. Traditionally, mechanical CAD data preparation has dominated many CAE activities, hindering use of advanced engineering simulation tools, and resulted in excessive cost across a broad range of design and manufacturing activities. The types of engineering simulation tools involved include, but are not limited to, analysis of mechanics, aerodynamics, thermodynamics, electromagnetics, fracture, aero-elasticity, noise, vibrations and transport phenomena.

9. For Harvesting Information from Design Repositories for Improved Design Decision Fidelity, Through Application of Big Data Analytics The big data analysis facilities can be used to harvest from existing design repositories. The ecosystem can help designers immediately find designs of interest. But in addition, the cross-correlations provided through the big data analytics enables designers to gleam as much information as possible from prior designs and feed into future designs. This may benefit large multi-national organizations which may have different design teams working on similar projects.

10. For Rapid Identification of Relevant Design Material, Through Application of Big Data Analytics, Say, for Post-Mortem Failure Analysis There is significant interest in big data analytics, especially within automotive industry. Lots of data is being collected from fleets of vehicles. The data is being uploaded to cloud systems, where it is analyzed using big data and machine learning algorithms. Then, information of interest can be communicated back to the drivers, or used internally, say, for post-mortem failure analysis.

11. As an Add-on or Plugin to the Electronic Lab Notebooks

The e-Design Assessment Engine can be utilized as an add-on to electronic lab notebooks running on mobile devices.

12. As Interface (Add-on or Plugin) to CAD Packages

The e-Design Assessment Engine, or other parts of the digital ecosystem for engineering design, can be integrated into CAD tools, such as AutoCAD, CATIA, PTC Creo, Unigraphics NX or SolidWorks, for example as a plug-in, and hence can benefit engineers involved in detailed design.

13. As Interface (Add-on or Plugin) to Tools for Design Validation

The digital ecosystem for engineering design supports interfaces with tools for design validation, e.g., with the FEA tools used to validate the stress analysis.

14. As Interface (Add-on or Plugin) to Tools for Requirement Management

The e-Design Assessment Engine can be integrated as an add-in, through a web API, into existing systems for requirements management, such as IBM Rational DOOR, IBM Rational Team Concert or Cockpit. In this way, the e-Design Assessment Engine can furnish these systems with capabilities for automatic verification of design requirements.

15. As Interface (Add-on or Plugin) to the PLM, DPM or CPD Systems

Similarly, the e-Design Assessment Engine can be integrated into the Product Lifecycle Management, Data Product Management or other tools for Collaborative Product Development (existing ecosystems) through the APIs provided.

These tools include, but are not limited to, the Siemens Team Center, SolidWorks PDM, CATIA Enovia PLM, PTC Windchill, Autodesk Fusion 360 PLM, and the Arena Solutions PLM.

6. Further Examples of the Invention

Thus, it will be appreciated by those skilled in the art that the present invention is not restricted to the particular preferred embodiments described with reference to the drawings, and that variations may be made therein without departing from the scope of the invention

The invention claimed is:

1. An apparatus, for design decision support, an apparatus capable of providing real-time feedback on design decisions, for the purpose of enabling discovery of problems early in a design process, where problems are less expensive to fix, an apparatus
   optionally supporting a cloud communication system,
   optionally supporting a web interface,
   supporting one or more interface with, or being integrated into, relevant development tools for engineering design,
   optionally supporting one or more interface with industry databases for codes or standards,
   optionally supporting a customizable supervisor mode,
   comprising one or more processors;
   comprising memory coupled to the one or more processors and storing instructions, which, when executed by the one or more processors, causes the one or more processors to perform operations comprising:
      feeding Customer Requirements from a User to a Requirement Analysis software,
      feeding Engineering Requirements from the Requirement Analysis software into software for associating key words from a given Engineering Requirement with appropriate design parameters from a specific output file from the development tools,
      feeding a Decomposed Concept Model from a Concept Design stage into software for associating key words for a given Engineering Requirement with appropriate design parameters from a specific output file from the development tools,
      providing a Risk Table from a Detailed Design stage to the software for associating key words from a given Engineering Requirement with appropriate parameters from a specific output file from the development tools,
      providing pertinent scripts from a Script Repository to the design tools, based on detailed analyses of relevance to address risks from the Risk Table,
      providing pertinent scripts from the Script Repository to the development tools,
      providing output of development tools to software for extracting the appropriate design parameters,
      associating appropriate design parameters from a specific output file from the design tools with key words from a given Engineering Requirement,
      providing software for automatic requirement compliance verification,
      provide outcome of the automatic requirement compliance verification to the User in the form of real-time alerts,
      providing the User with design information resulting from a Final Design stage.

2. An apparatus according to claim 1, wherein automatic verification, early identification and prompt notification of design oversights, with design oversight defined as incomplete fulfillment of one or more design requirements, is accomplished by extracting the relevant design parameters through application program interfaces, provided by the vendors of engineering design tools being used, and mapping against the design requirements, an apparatus wherein the output from a given development tool is decoded and associated with key words from the relevant engineering requirements.

3. An apparatus according to claim 2, wherein the design parameters are mapped against the design requirements by utilizing an association specified in a table summarizing the relevant risk factors.

4. An apparatus according to claim 1, wherein engineering requirements are structured in the form of cascaded functional requirements, and associated performance requirements, so as to enable automatic identification of the key words and parameters needed for automatic identification of the extent to which the engineering requirement has been fulfilled.

5. An apparatus according to claim 1, wherein functional analysis is applied to transfigure the functional model to a design tree representing hierarchical arrangement of design features and their associated functional requirements, corresponding to known design risks to be analyzed, for purpose of accounting for parameter dependence.

6. An apparatus according to claim 1, wherein the design tree can account for dependence between parts and subassemblies comprising an overall assembly, as well as for dependence between global, also referred to as baseline, and local, also referred to as incremental, requirements.

7. An apparatus according to claim 1, wherein the user interface consists of a three-level tab structure, with the highest level specifying the name of a project or subsystem, the second level specifying the name of a design phase for a particular project or subsystem, and the third level specifying the name of a design step within a particular design phase.

8. An apparatus according to claim 1, wherein the customer requirements are objectively ranked, for the purpose of reducing preferential subjectivity on account of designers as well as unintentional customer subversion, such as to reduce Condorcet preference aggregations in the selection of choices, and wherein the importance, or priority, of given requirements, as defined by the customers, is captured in an objective function used for optimization of the concept designs.

9. An apparatus according to claim 1, wherein the development tools are configured using a scripts from a repository to conduct analyses necessary to determine the extent to which a candidate design fulfills a given requirement.

10. An apparatus according to claim 1, wherein the interface with the database for codes and standards allows verification of relevance of the content provided with the engineering topic at hand.

11. An apparatus according to claim 1, wherein the interface with the relevant development tools for engineering design is implemented through use of software libraries, referred to as wrappers, which are introduced to abstract away, or eliminate, dependence of the apparatus on software constructs specific to the development tools for engineering design.

12. An apparatus according to claim 1, wherein conflict between design entities at different steps within the design process is avoided by synchronizing different steps with a master database, utilizing a model-view-controller, and wherein the master database, also referred to as golden repository, only stores a single copy of each design entity.

13. An apparatus according to claim 1, capable of launching, or integrating into, commercial tools for solid modeling, finite element analysis or computational fluid dynamics, through an interface, and combining with custom processing functions, for improved performance.

14. An apparatus according to claim 1, wherein the apparatus has the ability to interface with, and import requirements from, established systems for requirements management, product lifecycle management, data product management or collaborative product development, or from a market requirement document, an apparatus capable of importing of requirements in the XML, YAML, HTML, KML, JSON, GeoJSON, CSV, Excel, SQL, DB, DBs, FlatFile, multi-line data or delimited text formats.

15. An apparatus according to claim 1, wherein the apparatus can be integrated as an add-in, through a web services application program interface, into existing systems for requirements management, product lifecycle management, data product management or collaborative product development, for the purpose of furnishing these existing systems with capabilities for automatic verification of design requirements.

16. An apparatus according to claim 1, wherein the apparatus provides designers with access to repositories of known good designs, and applies big data analysis to the aggregate design content provided, for the purpose of improving fidelity of the design decisions, or for rapid identification of relevant design material.

17. An apparatus according to claim 1, capable of big data analysis, wherein
the apparatus utilizes design workbooks for accessing existing data in organized databases and creates pointers to pertinent design content,
the content created in the workbooks is structured to facilitate storage for future utility,
the workbook input format allows preservation of context with content,
useful third-party data is available in the organized databases with context provided.

18. An apparatus according to claim 1, capable of big data analysis, wherein
the apparatus utilizes a database storing the product design specification, and wherein
the product design specification database comprises of customer and requirement objects,
design database comprises of component and assembly objects,
both the customer, requirement, component and assembly objects can have hierarchy imposed.

19. An apparatus according to claim 1, capable of big data analysis, wherein the apparatus utilizes a design database comprising of component and assembly objects, and wherein options and risk items corresponding to the component objects can be programmed into the database based on existing engineering knowledge.

20. An apparatus according to claim 1, capable of big data analysis, wherein the apparatus interfaces with design content organized in the form of relational databases, or is integrated into existing systems for big data analysis.

21. An apparatus according to claim 1, capable of providing instantaneous simulation results for parts and assemblies directly in a modeling environment, and of updating dynamically as users edit or create features, so that users can instantly view the impact of design decisions in the modeling environment.

22. A method for design decision support, a method capable of providing real-time feedback on design decisions, for purpose of enabling discovery of problems early in the design process, where the problems are less expensive to fix, a method
with an optional a cloud communication step,
with an optional web interfacing step,
with a step for interfacing with relevant development tools for engineering design,
with an optional step for interfacing with one or more industry databases for codes or standards,
with a step for optionally accessing a customizable supervisor mode,
a method comprising
feeding Customer Requirements from a User to a Requirement Analysis step,
feeding Engineering Requirements from the Requirement Analysis step to a step where key words from a given Engineering Requirement are associated with appropriate design parameters from a specific output file from the development tools,
feeding a Decomposed Concept Model from a Concept Design step to a step where key words for a given Engineering Requirement are associated with appropriate design parameters from a specific output file from the development tools,
providing a Risk Table from a Detailed Design step to a step where key words from a given Engineering Requirement are associated with appropriate parameters from a specific output file from the development tools,
providing pertinent scripts from a Script Repository to the development tools, based on detailed analyses of relevance to address risks from the Risk Table,
providing pertinent scripts from the Script Repository to the development tools,
providing output of development tools to a step for extracting the appropriate design parameters,
associating appropriate design parameters from a specific output file from the design tools with key words from a given Engineering Requirement,
conducting automatic requirement compliance verification, relaying the outcome of the automatic requirement compliance verification to the User in the form of real-time alerts, providing the User with design information resulting from a Final Design step.

23. A method according to claim 22, capable of producing instantaneous simulation results for parts and assemblies directly in a modeling environment, and of updating dynamically as users edit or create features, so that users can instantly view the impact of design decisions in the modeling environment.

* * * * *